United States Patent
Yoshida

(10) Patent No.: US 12,532,607 B2
(45) Date of Patent: Jan. 20, 2026

(54) DISPLAY DEVICE AND METHOD FOR MANUFACTURING SAME

(71) Applicant: SHARP KABUSHIKI KAISHA, Sakai (JP)

(72) Inventor: Tokuo Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 601 days.

(21) Appl. No.: 17/915,212

(22) PCT Filed: Apr. 14, 2020

(86) PCT No.: PCT/JP2020/016441
§ 371 (c)(1),
(2) Date: Sep. 28, 2022

(87) PCT Pub. No.: WO2021/210067
PCT Pub. Date: Oct. 21, 2021

(65) Prior Publication Data
US 2023/0121662 A1 Apr. 20, 2023

(51) Int. Cl.
| | |
|---|---|
| *H10K 59/121* | (2023.01) |
| *H10K 59/12* | (2023.01) |
| *H10K 59/131* | (2023.01) |
| *H10K 59/80* | (2023.01) |
| *H10K 59/88* | (2023.01) |
| *H05B 33/02* | (2006.01) |
| *H05B 33/10* | (2006.01) |

(Continued)

(52) U.S. Cl.
CPC ....... *H10K 59/1213* (2023.02); *H10K 59/131* (2023.02); *H10K 59/88* (2023.02); *H10K 59/1201* (2023.02); *H10K 59/8731* (2023.02)

(58) Field of Classification Search
CPC ............. H10K 59/1213; H10K 59/131; H10K 59/88; H10K 71/00; H10K 59/123; H10K 59/124; H05B 33/02; H05B 33/10; H05B 33/26
See application file for complete search history.

(56) References Cited

U.S. PATENT DOCUMENTS

| | | | |
|---|---|---|---|
| 9,035,854 B2 * | 5/2015 | Lee | ...... H10K 59/131 345/80 |
| 2009/0184636 A1 * | 7/2009 | Cok | ...... H10K 59/80524 313/505 |

(Continued)

FOREIGN PATENT DOCUMENTS

JP 2018049774 A 3/2018

*Primary Examiner* — Jacob Y Choi
(74) *Attorney, Agent, or Firm* — ScienBiziP, P.C.

(57) ABSTRACT

An organic EL display device includes a TFT layer, and a light-emitting element layer provided on the TFT layer. A light emission control transistor of the TFT layer includes a conduction electrode connected to a first electrode of the light-emitting element layer through a contact hole of a flattening film. The TFT layer includes an emission control wiring line connected to the light emission control transistor, an interlayer insulating film provided between the emission control wiring line and the conduction electrode, and a dummy electrode covered with the interlayer insulating film and having an island shape. The dummy electrode overlaps the first electrode, the contact hole, and the conduction electrode in a plan view.

9 Claims, 31 Drawing Sheets

(51) Int. Cl.
*H05B 33/26* (2006.01)
*H10K 59/124* (2023.01)

(56) References Cited

U.S. PATENT DOCUMENTS

| | | | |
|---|---|---|---|
| 2014/0117360 A1* | 5/2014 | Shin | H10D 30/673 |
| | | | 257/59 |
| 2017/0069699 A1* | 3/2017 | Kim | H10D 86/60 |
| 2018/0090549 A1 | 3/2018 | Hamada et al. | |
| 2018/0219029 A1* | 8/2018 | Hanyu | H01L 21/0262 |
| 2020/0027933 A1* | 1/2020 | Heo | H10K 59/8723 |

* cited by examiner

DISPLAY DEVICE AND METHOD FOR MANUFACTURING SAME

TECHNICAL FIELD

The disclosure relates to a display device and a manufacturing method thereof.

BACKGROUND ART

In recent years, a self-luminous type organic ElectroLuminescence (EL) display device using an organic EL element has attracted attention as a display device that can replace a liquid crystal display device.

In the organic EL display device, a plurality of organic EL elements provided in a predetermined array individually constitute each of subpixels that form a display region for displaying an image. Each of the organic EL elements includes a first electrode, an organic EL layer provided on the first electrode, and a second electrode provided on the organic EL layer. The organic EL layer is formed by laminating a plurality of function layers made of an organic material. One layer among the plurality of function layers (for example, a light-emitting layer) is often separately provided for each organic EL element.

The function layer individually provided for each organic EL element is formed by vapor deposition, for example, by using a film-forming mask called a Fine Metal Mask (FMM) provided with a plurality of openings capable of patterning in units of subpixel. Thus, in order to maintain a distance between a surface that is a target for the vapor deposition and that forms the individual function layer and the film-forming mask, a mask spacer that comes into contact with the film-forming mask may be provided around the first electrode in the organic EL display device (see, for example, PTL 1).

CITATION LIST

Patent Literature

PTL 1: JP 2018-49774 A

SUMMARY

Technical Problem

In the organic EL display device, some function layers constituting the organic EL layer may be provided common to the plurality of organic EL elements. In the above-mentioned organic EL display device including the mask spacer, such a common function layer is provided so as to cover the mask spacer. Covering the mask spacer by the common function layer may cause a line defect in which pixels causing a display failure appear continuously in one direction of the display region in manufacturing of the organic EL display device.

Specifically, in manufacturing of the organic EL display device, when the individual function layer is formed to separate the film-forming mask from the mask spacer, peeling electrification may occur between the film-forming mask and the mask spacer. At this time, when the mask spacer is covered by the function layer, the first electrode is charged through the function layer. The first electrode is connected to a conduction electrode of a thin film transistor (hereinafter, referred to as TFT) provided in a lower layer than that provided with the organic EL element through a contact hole formed in a flattening film covering the TFT. A control wiring line connected to the gate of the TFT typically extends near a connection point between the conduction electrode of the TFT and the first electrode. Thus, Electro Static Discharge (ESD) is likely to occur between the conduction electrode of the TFT and the control wiring line. When such electrostatic discharge occurs, a discharged current is transmitted through the control wiring line, breaking an electric element in a drive circuit to which the control wiring line is connected. As a result, the drive circuit cannot operate the TFT connected to the control wiring line in a normal manner, and a line defect occurs.

An object of a technique according to the disclosure is to suppress the occurrence of electrostatic discharge between the conduction electrode of the TFT and the control wiring line.

Solution to Problem

A target of the technique according to the disclosure is a display device. The display device according to the technique of the disclosure includes a substrate, a TFT layer provided on the substrate, the TFT layer including a plurality of TFTs, and a light-emitting element layer provided on the TFT layer, the light-emitting element layer including a plurality of light-emitting elements. The light-emitting element layer includes a first electrode provided for each light-emitting element, a light-emitting function layer provided on the first electrode, a second electrode provided on the light-emitting function layer, and a mask spacer covered by the light-emitting function layer. The plurality of TFTs include a light emission control transistor covered with a flattening film provided on the TFT layer, the light emission control transistor being provided for each light-emitting element.

The light emission control transistor includes a conduction electrode electrically connected to the first electrode through a contact hole formed in the flattening film. The TFT layer includes a control wiring line electrically connected to the light emission control transistor, and an interlayer insulating film provided between the control wiring line and the conduction electrode. The control wiring line is electrically connected to a drive circuit configured to supply a signal to the light emission control transistor. The TFT layer further includes a dummy electrode covered with the interlayer insulating film, the dummy electrode having an island shape, the dummy electrode being formed of a conductive material. The dummy electrode is provided to overlap the first electrode, the contact hole in the flattening film, and the conduction electrode of the light emission control transistor in a plan view.

Advantageous Effects of Disclosure

The display device according to the technique of the disclosure can generate electrostatic discharge between the conduction electrode of the TFT and the dummy electrode in a case where peeling electrification occurs between a film-forming mask and the mask spacer when the film-forming mask is separated from the mask spacer after the individual function layers are formed in manufacturing the organic EL display device, because the dummy electrode is covered with the interlayer insulating film, and is provided to overlap the first electrode, the contact hole of the flattening film, and the conduction electrode of the light emission control transistor in a plan view, in the TFT layer. This makes it possible to suppress the occurrence of electrostatic discharge between the conduction electrode of the TFT and the control wiring line.

DESCRIPTION OF EMBODIMENTS

Figure 1:
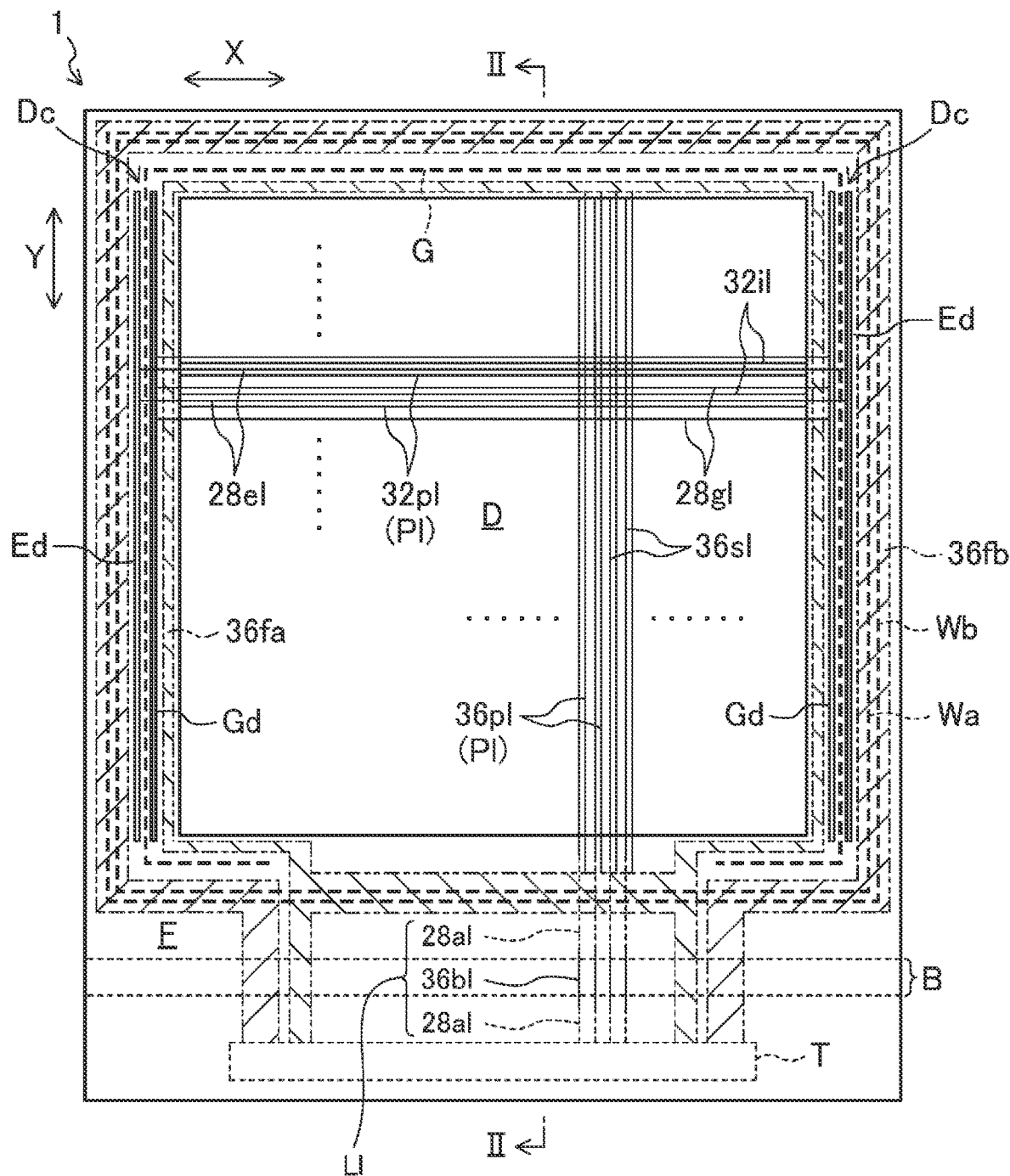
FIG. 1 is a plan view illustrating a schematic configuration of an organic EL display device according to a first embodiment.

Exemplary embodiments will be described below in detail with reference to the drawings. In the following embodiments, an organic EL display device including organic EL elements will be described as an example of a display device according to the technique of the disclosure.

Note that, in the following embodiments, a description stating that a constituent element such as a film, layer, element, or the like is provided or formed on another constituent element such as another film, layer, element, or the like means not only a case in which a constituent element is provided directly on another constituent element, but also a case in which still another constituent element such as still another film, layer, element, or the like is interposed between the constituent element and the other constituent element.

Further, in the following embodiments, a description stating that a constituent element such as a film, layer, element, or the like is connected to another constituent element such as another film, layer, element, or the like means that the constituent element and the other constituent element are electrically connected to each other unless otherwise stated. This description means, without departing from the gist of the technique of the disclosure, not only a case in which a constituent element is directly connected to another constituent element, but also a case in which a constituent element and another constituent element are indirectly connected to each other with still another constituent element such as still another film, layer, element, or the like interposed therebetween. This description also includes a case in which a constituent element is integrated with another constituent element, that is, a part of a constituent element constitutes another constituent element.

Further, in the following embodiments, a description stating that a constituent element such as a film, layer, element, or the like is in the same layer as another constituent element such as another film, layer, element, or the like means that the constituent element and the other constituent element are formed by the same process. A description stating that a constituent element such as a film, layer, element, or the like is in a lower layer than another constituent element such as another film, layer, element, or the like means that the constituent element is formed by an earlier process than that of the other constituent element. A description stating that a constituent element such as a film, layer, element, or the like is in an upper layer than another constituent element such as another film, layer, element, or the like means that the constituent element is formed by a later process than that of the other constituent element.

Further, in the following embodiments, a description stating that a constituent element such as a film, layer, element, or the like is identical or equivalent to another constituent element such as another film, layer, element, or the like means not only a state in which the constituent element and the other constituent element are completely identical or completely equivalent to each other, but also a state in which the constituent element and the other constituent element are substantially identical or substantially equivalent to each other within a range in which they vary due to manufacturing variations or variations within tolerances.

Further, in the following embodiments, terms "first", "second", "third", . . . are used for distinguishing objects to which those terms are attached, and are not limited to the number of objects or an order of the objects in any way.

First Embodiment

Figure 2:
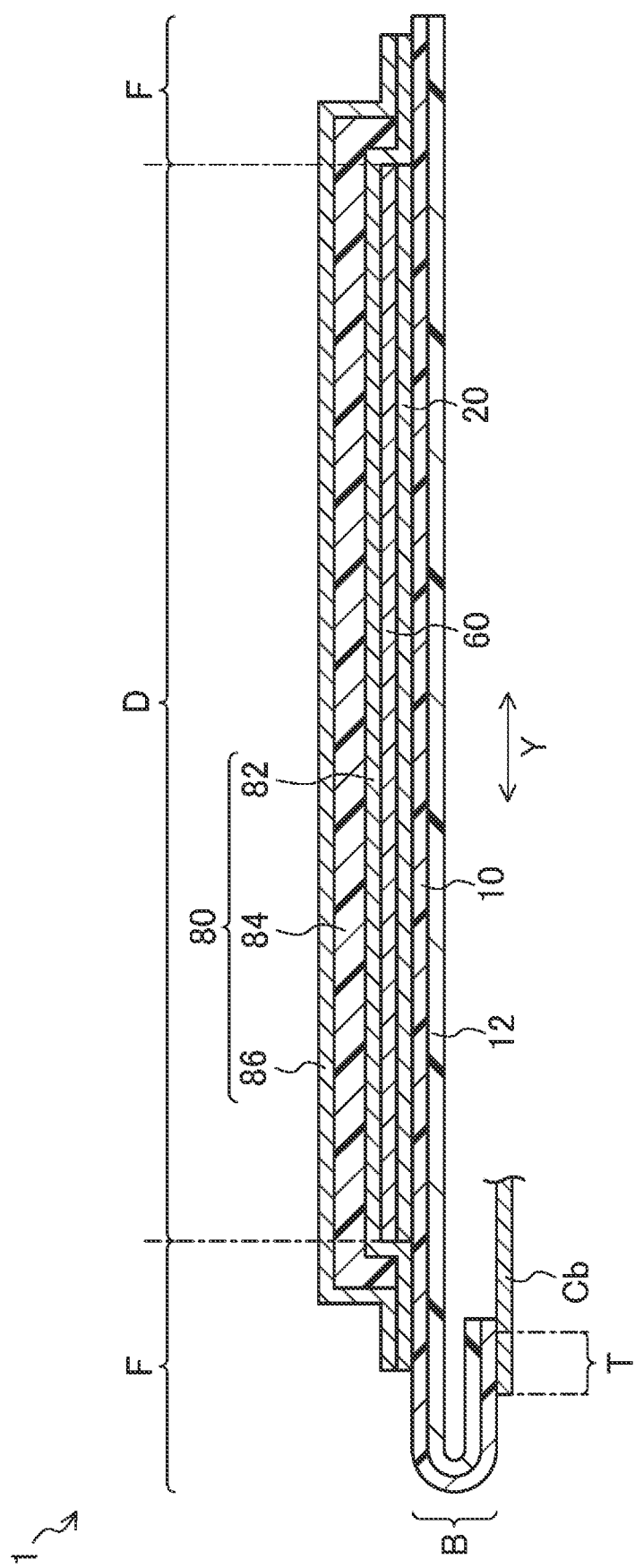
FIG. 2 is a cross-sectional view of the organic EL display device taken along a line II-II in FIG. 1.
Figure 3:
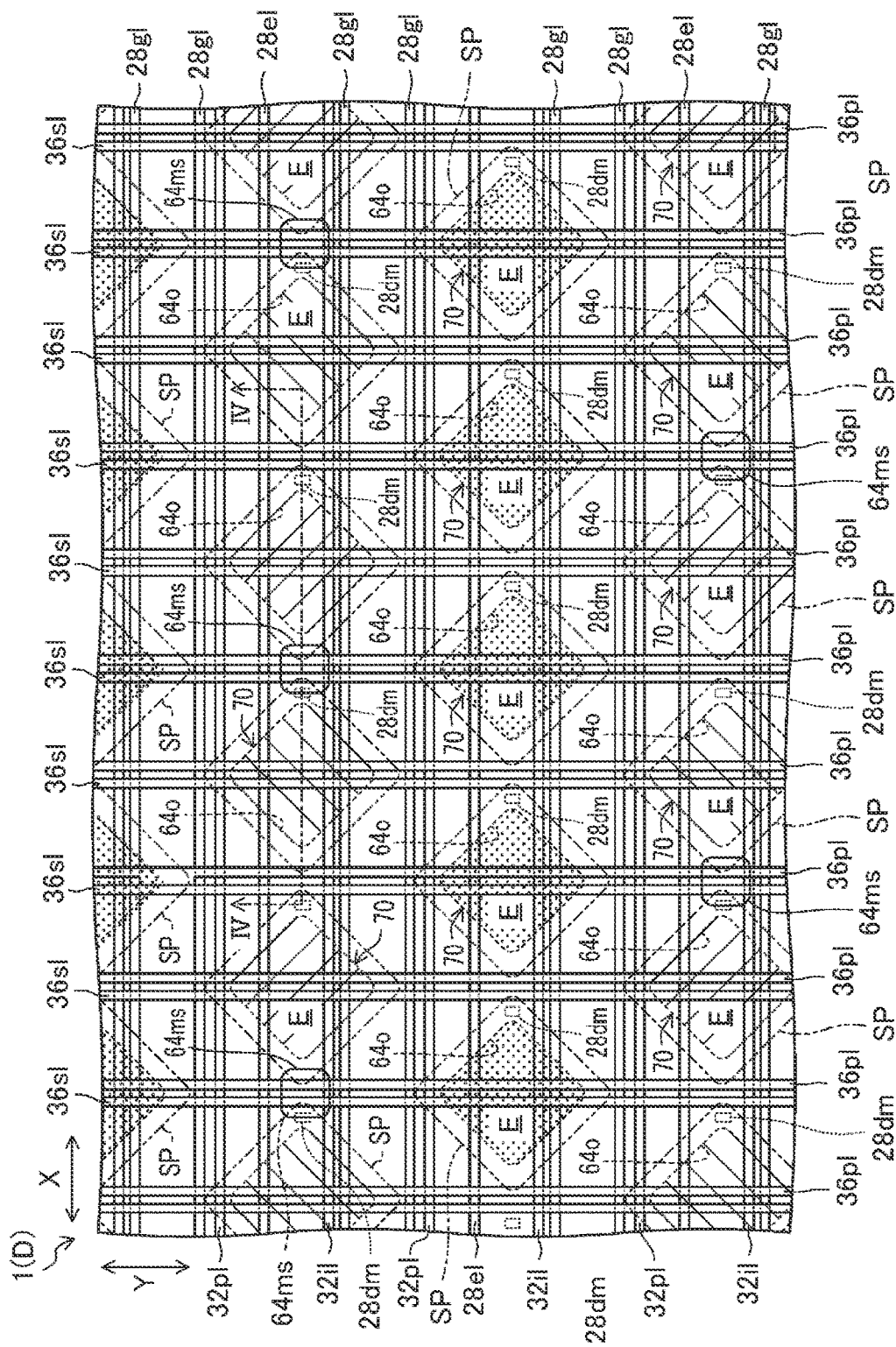
FIG. 3 is a plan view illustrating a display region of the organic EL display device according to the first embodiment.
Figure 4:
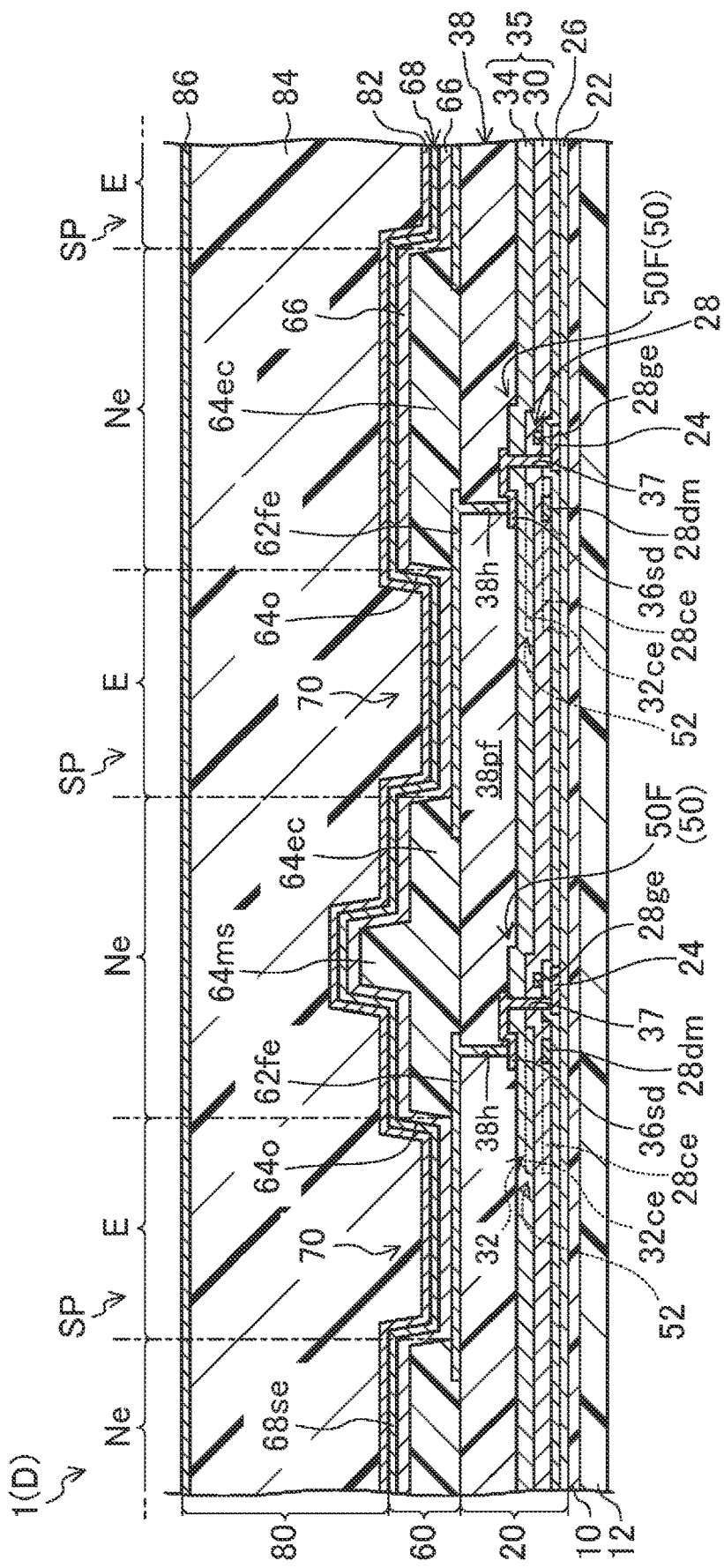
FIG. 4 is a cross-sectional view of the organic EL display device taken along a line IV-IV in FIG. 3.

FIG. 1 is a plan view illustrating a schematic configuration of an organic EL display device 1 according to a first embodiment. FIG. 2 is a cross-sectional view of the organic EL display device 1 taken along a line II-II in FIG. 1. FIG. 3 is a plan view illustrating a display region D of the organic EL display device 1 according to the first embodiment. FIG. 4 is a cross-sectional view of the organic EL display device 1 taken along a line IV-IV in FIG. 3.

Configuration of Organic EL Display Device

As illustrated in FIG. 1 and FIG. 2, the organic EL display device 1 includes the display region D configured to display an image and a frame region F provided on the periphery of the display region D.

The display region D is a rectangular region constituting a screen. In the present embodiment, although the display region D having the rectangular shape is illustrated as an example, the display region D may have a substantially rectangular shape such as a shape whose sides are arc-shaped, a shape whose corners are arc-shaped, a shape in which a part of a side has a notch, or the like. As illustrated in FIGS. 3 and FIG. 4, the display region D is constituted by a plurality of subpixels SP.

The plurality of subpixels SP are arrayed so as to form an oblique lattice pattern. As the plurality of subpixels SP, a plurality of subpixels SP each of which includes a light-emitting region E (indicated by hatching using diagonal lines extending upward to the left in FIG. 3) that emits red light, a plurality of subpixels SP each of which includes a light-emitting region E (indicated by hatching using dots in FIG. 3) that emits green light, and a plurality of subpixels SP each of which includes a light-emitting region E (indicated by hatching using diagonal lines extending upward to the right in FIG. 3) that emits blue light are included. The subpixels SP corresponding to three colors are arranged so as to be adjacent to each other. A combination of the subpixels SP corresponding to three colors constitutes one pixel.

As illustrated in FIG. 1 and FIG. 2, the frame region F is a region having a rectangular frame shape and constituting a non-display portion other than the screen. A terminal portion T to be connected to an external circuit is provided in a portion constituting one side of the frame region F. A bending portion B that is bendable with a first direction X, which is the horizontal direction in FIG. 1, as the bending axis is provided between the display region D and the terminal portion T in the frame region F.

The terminal portion T is disposed at the back face side of the organic EL display device 1 by the frame region F being bent, for example, by 180° (in a U shape) at the bending portion B. The terminal portion T is connected to a wiring line substrate Cb such as a Flexible Printed Circuit (FPC). A plurality of lead-out wiring lines Ll drawn from the display region D to the terminal portion T are provided in the frame region F. The plurality of lead-out wiring lines Ll are connected to a display control circuit (not illustrated) via the wiring line substrate Cb at the terminal portion T.

In the frame region F, in a flattening film 38*pf*, which will be described below, a trench G is provided so as to surround the display region D in a frame-like shape. The trench G extends in a substantially C-shape in a plan view, and is open at the terminal portion T side. The trench G may be provided over the entire periphery of the display region D. The trench G penetrates the flattening film 38*pf*, and divides the flattening film 38*pf* into an inner side and an outer side of the frame region F. The trench G plays a role of preventing infiltration of moisture or the like into the display region D.

In the frame region F, a drive circuit Dc including a gate driver Gd and an emission driver Ed is monolithically provided in a portion constituting sides adjacent to the side at which the terminal portion is provided (both left and right sides in FIG. 1). The gate driver Gd is disposed closer to the display region D side than the trench G. The emission driver Ed is disposed closer to the outer peripheral side of the frame region than the trench G. The arrangement of the gate driver Gd and the emission driver Ed with respect to the trench G may be reversed. Additionally, both the gate driver Gd and the emission driver Ed are disposed closer to the display region D side than the trench G.

The frame region F is provided with a first frame wiring line 36*fa* (indicated by hatching using diagonal lines extending upward to the left in FIG. 1) and a second frame wiring line 36*fb* (indicated by hatching using diagonal lines extending upward to the right in FIG. 1). The first frame wiring line 36*fa* is provided, in a frame shape, closer to the display region D side than the trench G and the drive circuit Dc. The first frame wiring line 36*fa* extends to the terminal portion T through the opening portion of the trench G in the frame region F. A high-level power supply voltage (ELVDD) is input to the first frame wiring line 36*fa* via the wiring line substrate Cb at the terminal portion T. The second frame wiring line 36*fb* is provided, in a substantially C-shape, closer to the outer peripheral side of the frame region F than the trench G and the drive circuit Dc. Both end portions of the second frame wiring line 36*fb* extend to the terminal portion T along the first frame wiring line 36*fa*. A low-level power supply voltage (ELVSS) is input to the second frame wiring line 36*fb* via the wiring line substrate Cb at the terminal portion T.

A first dam wall Wa and a second dam wall Wb are provided in the frame region F. The first dam wall Wa is provided in a frame shape at the outer periphery of the trench G. The second dam wall Wb is provided in a frame shape at the outer periphery of the first dam wall Wa. When an organic material that forms an organic layer 84 to be included in a sealing film 80 is applied in a manufacturing process of the organic EL display device 1, the first dam wall Wa and the second dam wall Wb play a role of damming an expansion of the organic material to the outer side of the frame region F.

The organic EL display device 1 employs an active matrix driving method in which light emission from each of the subpixels SP is controlled by a TFT 50 and an image is displayed by the action of the TFT 50. As illustrated in FIG. 2 and FIG. 4, the organic EL display device 1 includes a resin substrate layer 10, a TFT layer 20 provided on the resin substrate layer 10, a light-emitting element layer 60 provided on the TFT layer 20, and the sealing film 80 provided on the light-emitting element layer 60.

Resin Substrate Layer

The resin substrate layer 10 is an example of a substrate forming a base. The resin substrate layer 10 is formed, for example, of a resin material such as polyimide resin, polyamide resin, epoxy resin or the like. The resin substrate layer 10 has flexibility. The resin substrate layer 10 may be constituted by a layered film formed by layering an inorganic insulating layer made of an inorganic material such as silicon oxide, silicon nitride, silicon oxynitride or the like, and a resin layer made of the above-described resin material. A back face protection film 12 is bonded to the back face of the resin substrate layer 10.

TFT Layer

The TFT layer 20 includes a plurality of TFTs 50. The TFT layer 20 includes a base coat film 22, a semiconductor layer 24, a gate insulating film 26, a first conductive layer 28, a first interlayer insulating film 30, a second conductive layer 32, a second interlayer insulating film 34, a third conductive layer 36, and a first resin layer 38, which are sequentially provided on the resin substrate layer 10.

The base coat film 22 is provided throughout the substantially entire surface of the resin substrate layer 10. The base coat film 22 is made of an inorganic material such as silicon oxide, silicon nitride, silicon oxynitride or the like. The base coat film 22 is constituted by a single-layer film or a layered film of an inorganic insulating layer.

The semiconductor layer 24 is an upper layer of the base coat film 22. A plurality of the semiconductor layers 24 are provided in island shapes on the base coat film 22. The semiconductor layer 24 is formed of a Low Temperature Polycrystalline Silicon (LTPS), an oxide semiconductor such as indium gallium zinc oxide (In—Ga—Zn—O based), or the like, for example. The semiconductor layer 24 includes a channel region, and a source region and a drain region that are provided to sandwich the channel region.

The gate insulating film 26 is continuously provided throughout the substantially entire surface of the base coat film 22 so as to cover each of the semiconductor layers 24. The gate insulating film 26 is made of an inorganic material such as silicon oxide, silicon nitride, silicon oxynitride or the like. The gate insulating film 26 is constituted by a single-layer film or a layered film of an inorganic insulating layer. The gate insulating film 26 may be provided in island shapes on each of the semiconductor layers 24.

The first conductive layer 28 is an upper layer of the gate insulating film 26. The first conductive layer 28 is provided on the gate insulating film 26. The first conductive layer 28 includes a plurality of gate electrodes 28*ge*, a plurality of emission control wiring lines 28*el*, a plurality of first partial wiring lines 28*al*, a plurality of gate wiring lines 28*gl*, a plurality of first capacitance electrodes 28*ce*, and a plurality of dummy electrodes 28*dm* (also see FIG. 1 and FIG. 3). The gate wiring lines 28*gl*, the emission control wiring lines 28*el*, the first partial wiring lines 28*al*, the gate electrodes 28*ge*, the first capacitance electrodes 28*ce*, and the dummy electrodes 28*dm* are formed of the same material in the same layer.

For example, the gate wiring lines 28*gl*, the emission control wiring lines 28*el*, the first partial wiring lines 28*al*, the gate electrodes 28*ge*, the first capacitance electrodes 28*ce*, and the dummy electrodes 28*dm* are made of a metal material such as aluminum (Al), tungsten (W), molybdenum (Mo), tantalum (Ta), chromium (Cr), titanium (Ti), copper (Cu) or the like. The gate wiring lines 28*gl*, the emission control wiring lines 28*el*, the first partial wiring lines 28*al*, the gate electrodes 28*ge*, the first capacitance electrodes 28*ce*, and the dummy electrodes 28*dm* are constituted by a single-layer film or a layered film of a metal layer.

The first interlayer insulating film 30 is an upper layer of the first conductive layer 28. The first interlayer insulating film 30 is provided so as to cover the gate wiring lines 28*gl*, the emission control wiring lines 28*el*, the first partial wiring lines 28*al*, the gate electrodes 28*ge*, the first capacitance electrodes 28*ce*, and the dummy electrodes 28*dm*. The first interlayer insulating film 30 is made of an inorganic material such as silicon oxide, silicon nitride, silicon oxynitride or the like. The first interlayer insulating film 30 is constituted by a single-layer film or a layered film of an inorganic insulating layer.

The second conductive layer 32 is an upper layer of the first interlayer insulating film 30. The second conductive layer 32 is provided on the first interlayer insulating film 30. The second conductive layer 32 includes a plurality of initialization power source wiring lines 32*il*, a plurality of first power source wiring lines 32*pl*, and a plurality of second capacitance electrodes 32*ce* (also see FIG. 1 and FIG. 3). The initialization power source wiring lines 32*il*, the first power source wiring lines 32*pl*, and the second capacitance electrodes 32*ce* are formed of the same material in the same layer.

For example, the initialization power source wiring lines 32*il*, the first power source wiring lines 32*pl*, and the second capacitance electrodes 32*ce* are made of a metal material such as aluminum (Al), tungsten (W), molybdenum (Mo), tantalum (Ta), chromium (Cr), titanium (Ti), copper (Cu) or the like. The initialization power source wiring lines 32*il*, the first power source wiring lines 32*pl*, and the second capacitance electrodes 32*ce* are constituted by a single-layer film or a layered film of a metal layer.

The second interlayer insulating film 34 is an upper layer of the second conductive layer 32. The second interlayer insulating film 34 is provided so as to cover the initialization power source wiring lines 32*il*, the first power source wiring lines 32*pl*, and the second capacitance electrodes 32*ce*. The second interlayer insulating film 34 is made of an inorganic material such as silicon oxide, silicon nitride, silicon oxynitride or the like. The second interlayer insulating film 34 is constituted by a single-layer film or a layered film of an inorganic insulating layer. The first interlayer insulating film 30 and the second interlayer insulating film 34 constitute an interlayer insulating film 35.

The third conductive layer 36 is an upper layer of the second interlayer insulating film 34. The third conductive layer 36 is provided on the second interlayer insulating film 34. The third conductive layer 36 includes a plurality of source wiring lines 36*sl*, a plurality of second power source wiring lines 36*pl*, a plurality of second partial wiring lines 36*bl*, the first frame wiring line 36*fa*, the second frame wiring line 36*fb*, and a plurality of conduction electrodes 36*sd* (also see FIG. 1 and FIG. 3). The source wiring lines 36*sl*, the second power source wiring lines 36*pl*, the second partial wiring lines 36*bl*, the first frame wiring line 36*fa*, the second frame wiring line 36*fa*, and the conduction electrodes 36*sd* are formed of the same material in the same layer.

For example, the source wiring lines 36*sl*, the second power source wiring lines 36*pl*, the second partial wiring lines 36*bl*, the first frame wiring line 36*fa*, the second frame wiring line 36*fb*, and the conduction electrodes 36*sd* are made of a metal material such as aluminum (Al), tungsten (W), molybdenum (Mo), tantalum (Ta), chromium (Cr), titanium (Ti), copper (Cu) or the like. The source wiring lines 36*sl*, the second power source wiring lines 36*pl*, the second partial wiring lines 36*bl*, the first frame wiring line 36*fa*, the second frame wiring line 36*fb*, and the conduction electrodes 36*sd* are constituted by a single-layer film or a layered film of a metal layer.

The first resin layer 38 is an upper layer of the third conductive layer 36. The first resin layer 38 includes the flattening film 38*pf* and a first wall layer (not illustrated). The flattening film 38*pf* and the first wall layer are formed of the same material in the same layer. For example, the flattening film 38*pf* and the first wall layer are made of a resin material such as polyimide resin.

The flattening film 38*pf* is provided to cover the source wiring lines 36*sl*, the second power source wiring lines 36*pl*, and the conduction electrodes 36*sd* in the display region D. The flattening film 38*pf* is also spread to a portion on the inner peripheral side of the frame region F. The two first wall layers are provided in a similar shape so as to doubly surround the flattening film 38*pf* in the frame region F. One first wall layer constitutes the first dam wall Wa, and the other first wall layer constitutes the second dam wall Wb.

Various Wiring Lines

As illustrated in FIG. 3, the plurality of gate wiring lines 28*gl* are provided in the display region D and extend in parallel to each other in the first direction X, The gate wiring line 28*gl* is a display wiring line that transmits a gate signal and is provided for each row of the subpixels SP. Each gate wiring line 28*gl* is connected to the gate driver Gd of the drive circuit Dc. Each gate wiring line 28*gl* is sequentially selected by the gate driver Gd at a predetermined timing, and brought into an active state.

The plurality of emission control wiring lines 28*el* are provided in the display region D and extend in parallel to each other in the first direction X. The emission control wiring line 28*el* is a display wiring line that transmits an emission control signal and is provided for each row of the subpixels SP. Each emission control wiring line 28*el* is connected to the emission driver Ed of the drive circuit Dc. Each emission control wiring line 28*el* is sequentially selected by the emission driver Ed at a predetermined timing, and brought into an inactive state.

The plurality of initialization power source wiring lines 32*il* are provided in the display region D and extend in parallel to each other in the first direction X. The initialization power source wiring line 32*il* is a wiring line that applies an initialization potential and is provided for each row of the subpixels SP. Each initialization power source wiring line 32*il* is connected to the drive circuit Dc. A predetermined initialization potential is applied to each initialization power source wiring line 32*il* by the drive circuit Dc.

The plurality of first power source wiring lines 32*pl* are provided in the display region D and extend in parallel to each other in the first direction X. The first power source wiring line 32*pl* is a wiring line that applies a predetermined high-level potential and is provided for each row of the subpixels SR Each first power source wiring line 32*pl* is connected to the first frame wiring line 36*fa* through a contact hole (not illustrated) formed in the second interlayer insulating film 34.

The plurality of source wiring lines 36*sl* are provided in the display region D and extend in parallel to each other in a second direction Y that is a direction (the vertical direction in FIG. 1) orthogonal to the first direction X. The source wiring line 36*sl* is a wiring line that transmits a source signal and is provided for each column of the subpixels SR Each source wiring line 36*sl* is connected to a lead-out wiring line Ll. Each source wiring line 36*sl* is connected to the display control circuit through the lead-out wiring line Ll.

The plurality of second power source wiring lines 36*pl* are provided in the display region D and extend in parallel to each other in the second direction Y. The second power source wiring line 36*pl* is a wiring line that applies a predetermined high-level potential and is provided for each column of the subpixels SP. Each second power source wiring line 36*pl* is connected to the first frame wiring line 36*fa*.

Each second power source wiring line 36*pl* intersects the first power source wiring lines 32*pl* with the second interlayer insulating film 34 interposed therebetween. Each second power source wiring line 36*pl* is connected to the first power source wiring line 32*pl* at an intersection therebetween, through a contact hole (not illustrated) formed in the second interlayer insulating film 34. The plurality of second power source wiring lines 36*pl* constitute power source wiring lines Pl together with the plurality of first power source wiring lines 32*pl*.

In the frame region F, the plurality of first partial wiring lines 28*al* are provided in each of a portion between the display region D and the bending portion B and a portion between the bending portion B and the terminal portion T, and extend in parallel to each other in the second direction Y in both the portions. Each first partial wiring line 28al positioned closer to the display region D side than the bending portion B is provided so as to pass under the first frame wiring line 36fa from the display region D side to the terminal portion T side. Each of the first partial wiring lines 28al is connected to the corresponding source wiring line 32sl through a contact hole formed in the interlayer insulating film 30. Each first partial wiring line 28al constitutes a part of the lead-out wiring line Ll.

The plurality of second partial wiring lines 36bl extend in parallel to each other in the second direction Y so as to straddle the bending portion B in the frame region F. Each second partial wiring line 36bl is connected to the first partial wiring line 28al positioned closer to the display region D side than the bending portion B through a contact hole formed in the interlayer insulating film 30, and the first partial wiring line 28al positioned closer to the terminal portion T side than the bending portion B. Each second partial wiring line 36bl connects the first partial wiring lines 28al provided separately at both sides of the bending portion B, and constitutes the lead-out wiring line Ll together with the first partial wiring lines 28al.

Various Electrodes

Figure 5:
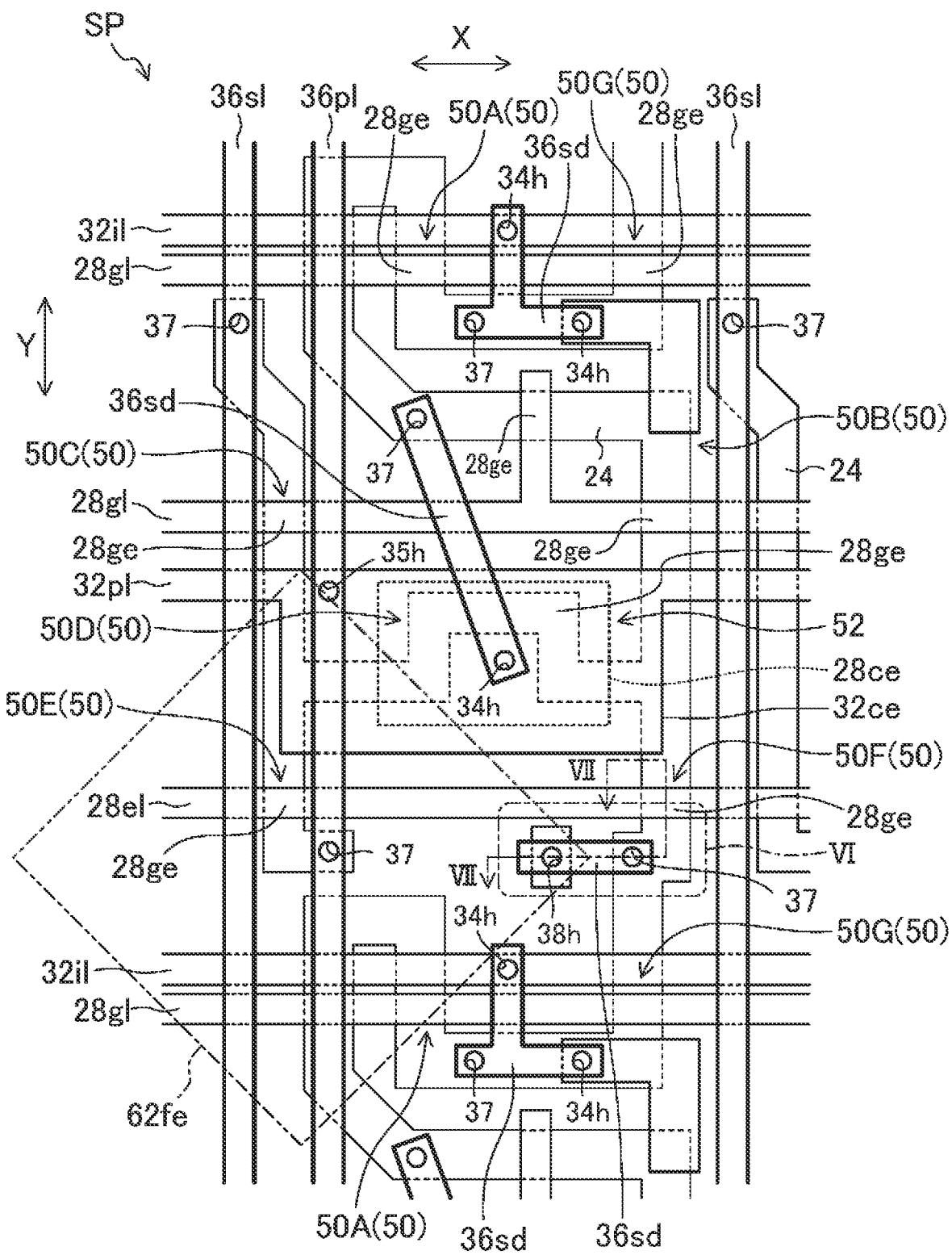
FIG. 5 is a plan view illustrating a schematic configuration of one subpixel positioned near the mask spacer and a periphery thereof in the organic EL display device according to the first embodiment.
Figure 6:
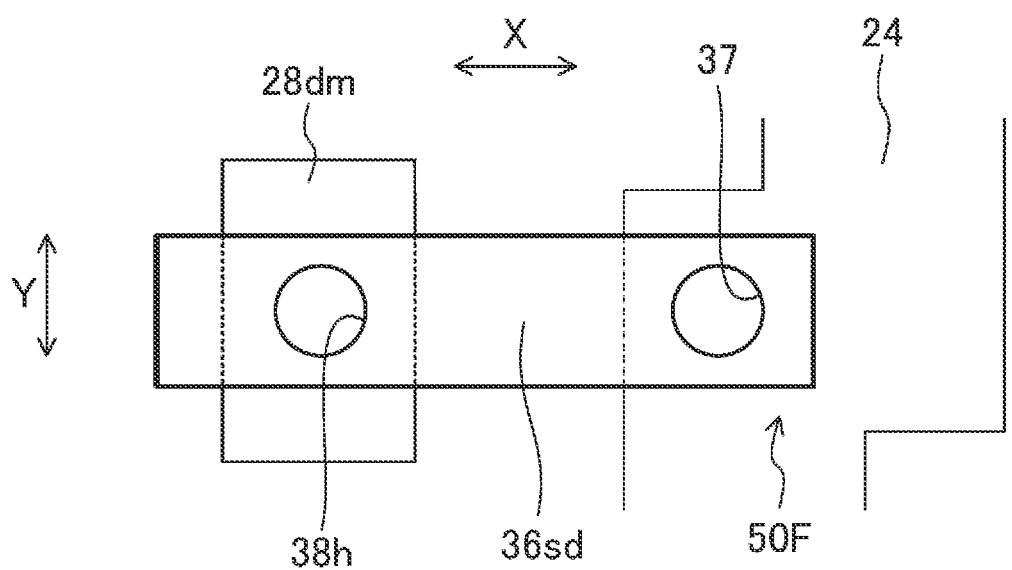
FIG. 6 is a plan view illustrating a main portion of the organic EL display device surrounded by VI in FIG. 5.

FIG. 5 is a plan view illustrating a schematic configuration of one subpixel SP positioned near the mask spacer 64ms and the periphery thereof in the organic EL display device 1 according to the first embodiment. FIG. 6 is a plan view illustrating a main portion of the organic EL display device 1 surrounded by VI in FIG. 5.

As illustrated in FIG. 5, a plurality of the gate electrodes 28ge and a plurality of the conduction electrodes 36sd are provided for each subpixel SP. The gate electrode 28ge and the conduction electrode 36sd are electrodes constituting the TFT 50. At least one first capacitance electrode 28ce and at least one second capacitance electrode 32ce are provided for each subpixel SP. The first capacitance electrode 28ce and the second capacitance electrode 32ce are electrodes constituting a capacitor 52.

Figure 7:
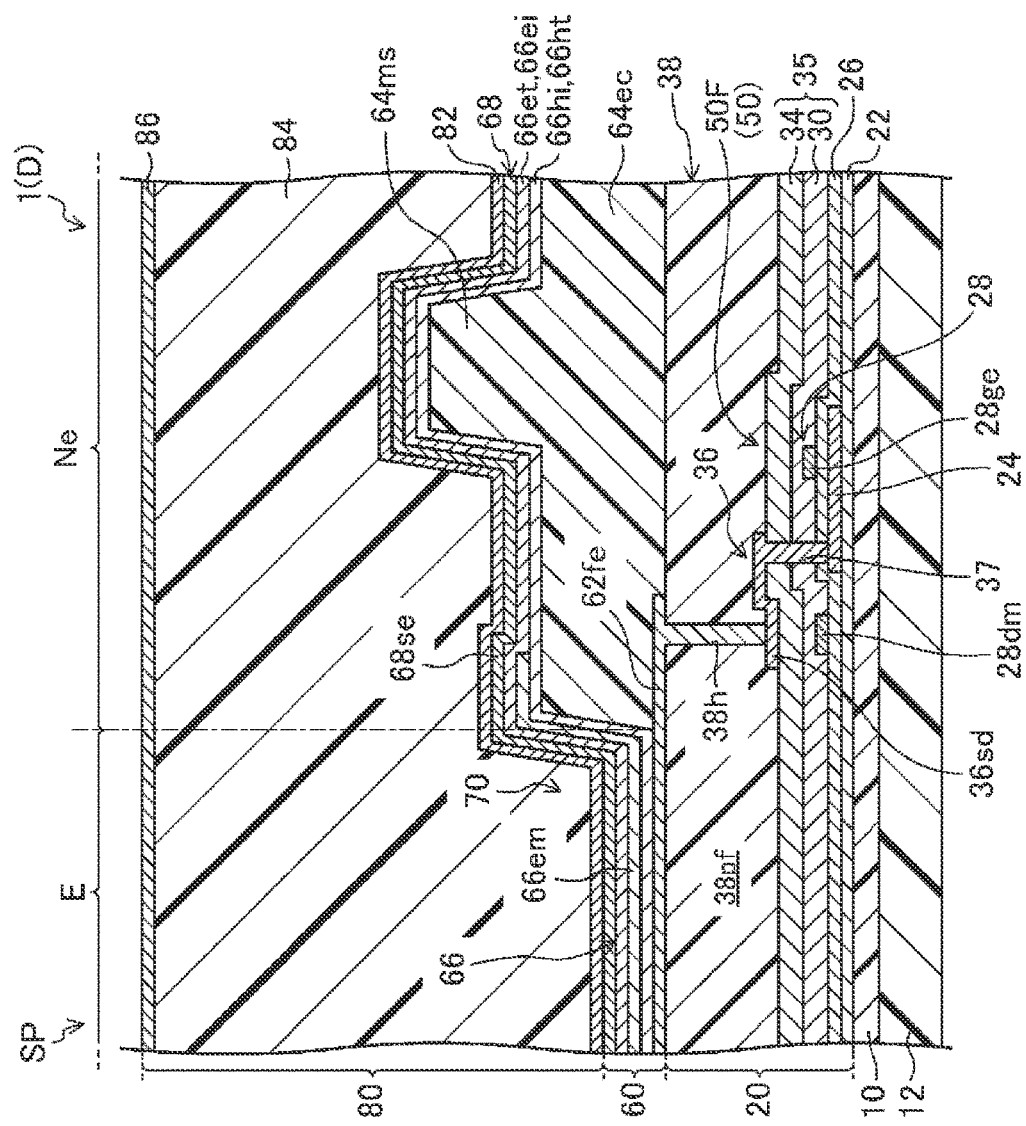
FIG. 7 is a cross-sectional view illustrating a main portion of the organic EL display device taken along a line in FIG. 5.

As also illustrated in FIG. 3 and FIG. 7, the dummy electrode 28dm is provided for each subpixel SP, with respect to the conduction electrode 36sd of the light emission control transistor 50F. Each dummy electrode 28dm is covered with the interlayer insulating film 35. In each subpixel SP, the dummy electrode 28dm overlaps the first electrode 62fe, a contact hole 38h of the flattening film 38pf, and the conduction electrode 36sd of the light emission control transistor 50F in a plan view.

As illustrated in FIG. 6, the dummy electrode 28dm and the conduction electrode 36sd of the light emission control transistor 50F extend in a direction intersecting each other. For example, the conduction electrode 36sd of the light emission control transistor 50F extends in the first direction X, and the dummy electrode 28dm extends in the second direction Y. The dummy electrode 28dm extends from one side to the other side in the width direction of the conduction electrode 36sd of the light emission control transistor 50F in a plan view.

TFT

A plurality of the TFTs 50 are provided for each subpixel SP. Each of the plurality of TFTs 50 is a top-gate type TFT. Each TFT 50 is constituted by the semiconductor layer 24, the gate insulating film 26, the gate electrode 28ge, and the conduction electrode 36sd. In some TFTs 50, the gate electrode 28ge is connected to the gate wiring line 28gl. In the other TFTs 50, the gate electrode 28ge is connected to the emission control wiring line 28el. The conduction electrode 36sd is connected to the source region or the drain region of the semiconductor layer 24 through the contact hole 37 formed in the gate insulating film 26 and the interlayer insulating film 35.

The plurality of TFTs 50 are a first initialization transistor 50A, a threshold value compensation transistor 50B, a write control transistor 50C, a drive transistor 50D, a power supply transistor 50E, a light emission control transistor 50F, and a second initialization transistor 50G. Among the plurality of TFTs 50, the first initialization transistor 50A includes the conduction electrode 36sd connected to the initialization power source wiring line 32il through the contact hole 34h formed in the second interlayer insulating film 34.

Additionally, the light emission control transistor 50F includes the conduction electrode 36sd connected to the first electrode 62fe through the contact hole 38h formed in the flattening film 38pf. The entire peripheral edge of the opening on the conduction electrode 36sd side of the contact hole 38h connecting the conduction electrode 36sd of the light emission control transistor 50F and the first electrode 62fe overlaps the conduction electrode 36sd and the dummy electrode 28dm in a plan view see FIG. 6). In addition, as the conduction electrode 36sd, the conduction electrode 36sd connecting the first initialization transistor 50A and the threshold value compensation transistor 50B with the capacitor 52 is provided. The conduction electrode 36sd is connected to the second capacitance electrode 32ce through the contact hole 34h formed in the second interlayer insulating film 34.

Capacitor

At least one capacitor 52 is provided for each subpixel SR The capacitor 52 is an element for storing data. The capacitor 52 is constituted by the first capacitance electrode 28ce, the first interlayer insulating film 30, and the second capacitance electrode 32ce. The first capacitance electrode 28ce and the second capacitance electrode 32ce overlap each other with the first interlayer insulating film 30 interposed therebetween.

Light-Emitting Element Layer

As illustrated in FIG. 3 and FIG. 4, the light-emitting element layer 60 includes a plurality of organic EL elements 70. The organic EL element 70 is an example of a light-emitting element. The light-emitting element layer 60 includes a fourth conductive layer 62, a second resin layer 64, an organic EL layer 66, and a fifth conductive layer 68 that are provided in order on the flattening film 38pf.

The fourth conductive layer 62 includes a plurality of first electrodes 62fe.

The first electrode 62fe is provided for each subpixel SP. The first electrode 62fe is connected to the conduction electrode 36sd of the light emission control transistor 50F among the plurality of TFTs 50 provided in the corresponding subpixel SP through the contact hole 38h formed in the flattening film 38pf. The first electrode 62fe functions as an anode electrode that injects positive holes (holes) into the organic EL layer 66. The first electrode 62fe has light reflectivity to reflect light.

Examples of a material of the first electrode 62fe include a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), tin (Sn) or the like.

Further, the material of the first electrode 62fe may be an alloy of astatine (At), astatine oxide (AtO2), and the like. Additionally, the material of the first electrode 62fe may be a conductive oxide such as tin oxide (SnO), zinc oxide (ZnO), indium tin oxide (ITO), indium zinc oxide (IZO) or the like. The first electrode 62*fe* is preferably formed of a material having a large work function to improve the efficiency of hole injection into the organic EL layer 66. The first electrode 62*fe* may be formed by layering a plurality of layers formed of any of the materials described above.

The second resin layer 64 includes an edge cover 64*ec*, the mask spacer 64*ms*, and a second wall layer (not illustrated). The edge cover 64*ec*, the mask spacer 64*ms*, and the second wall layer are formed of the same material in the same layer. Examples of the material of the edge cover 64*ec*, the mask spacer 64*ms*, and the second wall layer include a resin material such as polyimide resin, acrylic resin, polysiloxane resin, and novolac resin.

The edge cover 64*ec* partitions the first electrodes 62*fe* of adjacent subpixels SP. The edge cover 64*ec* is formed in an oblique lattice pattern as a whole, and covers a peripheral edge portion of each of the first electrodes 62*fe*. An opening 64*o* that exposes the first electrode 62*fe* is formed in the edge cover 64*ec* for each subpixel SP. The edge cover 64*ec* constitutes a non-emitting light region Ne between the light-emitting regions E of adjacent subpixels SP.

A part of the surface of the edge cover 64*ec* protrudes upward to constitute the mask spacer 64*ms*. The mask spacer 64*ms* is a columnar spacer for maintaining an interval between the surface of a film-forming target and a film-forming mask 100 to be used for forming a function layer (for example, the light-emitting layer 66*em*) constituting the organic EL layer 66 in manufacturing of the organic EL display device 1. The mask spacer 64*ms* is provided in the non-emitting light region Ne at every plurality of subpixels SP. The mask spacer 64*ms* is positioned around the conduction electrode 36*sd* of the light emission control transistor 50F.

The two second wall layers are provided in a similar shape so as to doubly surround the flattening film 38*pf* in the frame region F. Each second wall layer is layered on the first wall layer. One first wall layer constitutes the first dam wall Wa, and the other first wall layer constitutes the second dam wall Wb.

Organic EL Layer

Figure 8:
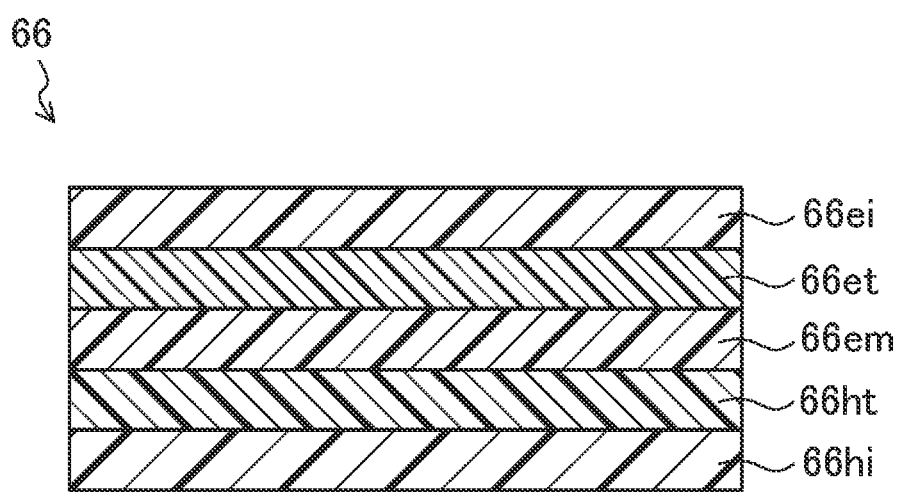
FIG. 8 is a cross-sectional view illustrating a layered structure of an organic EL layer in the organic EL display device according to the first embodiment.

FIG. 8 is a cross-sectional view illustrating a layered structure of the organic EL layer 66. The organic EL layer 66 is an example of a light-emitting function layer. As illustrated in FIG. 8, the organic EL layer 66 includes a hole injection layer 66*hi*, a hole transport layer 66*ht*, a light-emitting layer 66*em*, an electron transport layer 66*et*, and an electron injection layer 66*ei* that are provided in order on the first electrode 62*fe*.

The hole injection layer 66*hi* is also referred to as an anode electrode buffer layer. The hole injection layer 66*hi* is a function layer that makes energy levels of the first electrode 62*fe* and the organic EL layer 66 closer to each other, and that improves the efficiency of hole injection into the organic EL layer 66 from the first electrode 62*fe*. Examples of the material of the hole injection layer 66*hi* include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, a stilbene derivative and the like.

The hole transport layer 66*ht* is a function layer that causes positive holes to efficiently move to the light-emitting layer 66*em*. Examples of the material of the hole transport layer 66*ht* include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, zinc selenide and the like.

The light-emitting layer 66*em* is a function layer that recombines a hole injected from the first electrode 62*fe* and an electron injected from the second electrode 68*se* to emit light when a voltage is applied by the first electrode 62*fe* and the second electrode 68*se*. The light-emitting layer 66*em* is formed of a different material depending on a luminescent color (red, green, or blue) of the organic element 70 in each subpixel SP, for example.

Examples of the material of the light-emitting layer 66*em* include a metal oxinoid compound (8-hydroxyquinoline metal complex), a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styrylamine derivative, a bisstyrylbenzene derivative, a trisstyrylbenzene derivative, a perylene derivative, a perinone derivative, an aminopyrene derivative, a pyridine derivative, a rhodamine derivative, an aquidine derivative, phenoxazone, a quinacridone derivative, rubrene, poly-p-phenylenevinylene, polysilane and the like.

The electron transport layer 66*et* is a function layer that causes electrons to efficiently move to the light-emitting layer 66*em*. Examples of the material of the electron transport layer 66*et* include an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 66*ei* is also referred to as a cathode electrode buffer layer. The electron injection layer 66*ei* is a function layer that makes energy levels of the second electrode 68*se* and the organic EL layer 66, closer to each other and that improves the efficiency of electron injection into the organic EL layer 66 from the second electrode 68*se*. Examples of the material of the electron injection layer 66*ei* include inorganic alkaline compounds such as lithium fluoride (LiF), magnesium fluoride (MgF2), calcium fluoride (CaF2), strontium fluoride (SrF2), barium fluoride (BaF2) and the like, aluminum oxide (Al2O3), and strontium oxide (SrO).

In the present configuration example, the light-emitting layer 66*em* is divided for individual subpixels SP and then provided on the individual first electrodes 62*fe* in each of the openings 64*o* of the edge cover 64*ec*. The hole injection layer 66*hi*, the hole transport layer 66*ht*, the electron transport layer 66*et*, and the electron injection layer 66*ei* other than the light-emitting layer 66*em* are commonly provided for the plurality of subpixels SR. All the hole injection layer 66*hi*, the hole transport layer 66*ht*, the electron transport layer 66*et*, and the electron injection layer 66*ei* cover each of the mask spacers 64*ms*. That is, each mask spacer 64*ms* is covered by the organic EL layer 66.

The fifth conductive layer 68 includes the second electrode 68se. The second electrode 68se is commonly provided for the plurality of subpixels SP. The second electrode 68se covers the organic EL layer 66 and the edge cover 64ec, and overlaps the first electrode 62fe with the organic EL layer 66 interposed therebetween. The second electrode 68se extends to the frame region F, and covers both the first dam wall Wa and the second dam wall Wb. The second electrode 68se is connected to the second frame wiring line 36fb. The second electrode 68se functions as a cathode electrode that injects electrons into the organic EL layer 66. The second electrode 68se has optical transparency to transmit light.

Examples of the material of the second electrode 68se include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), lithium fluoride (LiF) and the like.

Further, the second electrode 68se may be formed of an alloy such as magnesium (Mg)-copper (Cu), magnesium (Mg)-silver (Ag), sodium (Na)-potassium (K), astatine (At)-astatine oxide (AtO2), lithium (Li)-aluminum (Al), lithium (Li)-calcium (Ca)-aluminum (Al), lithium fluoride (LiF)-calcium (Ca)-aluminum (Al) or the like.

Furthermore, the second electrode 68se may be formed of conductive oxide such as tin oxide (SnO), zinc oxide (ZnO), indium tin oxide (ITO), indium zinc oxide (IZO) and the like. The second electrode 68se is preferably formed of a material having a small work function to improve the efficiency of electron injection into the organic EL layer 66. The second electrode 68se may be formed by layering a plurality of layers formed of any of the materials described above.

The first electrode 62fe, the organic EL layer 66, and the second electrode 68se constitute the organic EL element 70. The organic EL element 70 is an example of a light-emitting element. The organic EL element 70 is a top-emitting type organic EL element. The organic EL element 70 is provided for each subpixel SP. Each of the plurality of organic EL elements 70 constitutes a subpixel SP.

Pixel Circuit

Figure 9:
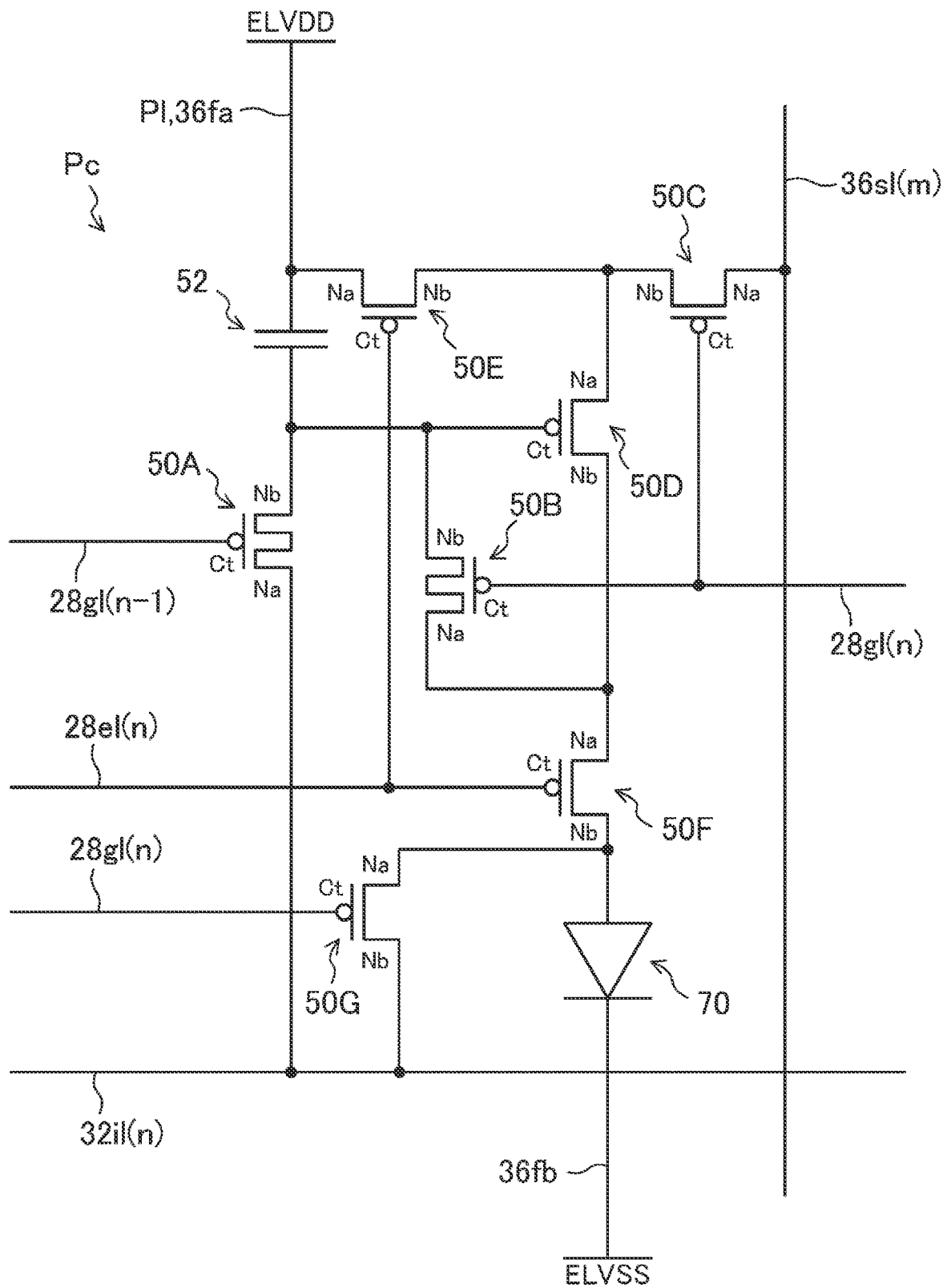
FIG. 9 is an equivalent circuit diagram illustrating a pixel circuit of the organic EL display device according to the first embodiment.

FIG. 9 is an equivalent circuit diagram illustrating an example of a pixel circuit Pc. The plurality of TFTs 50, the capacitor 52, and the organic EL element 70 that are provided for each of the subpixels SP constitute the pixel circuit Pc, as illustrated in FIG. 9. The pixel circuit Pc controls light emission of the organic EL element 70 in the light-emitting region E of the corresponding subpixel SP based on a gate signal supplied from the gate wiring line 28gl, an emission signal supplied from the emission control wiring line 28el, an initialization potential supplied from the initialization power source wiring line 32il, a source signal supplied from the source wiring line 36sl, a high-level potential supplied from the power source wiring line Pl, and a low-level potential supplied from the second electrode 68se.

The pixel circuit Pc illustrated in FIG. 9 is the pixel circuit Pc of the subpixel SP at the m-th row and nth column (m and n are positive integers). In FIG. 9, the source wiring line 36sl whose reference numeral is added with (m) is the source wiring line 36sl corresponding to the subpixels SP in the m-th row. The gate wiring line 28gl and the emission control wiring line 28el whose reference numerals are added with (n) are the gate wiring line 28gl and the emission control wiring line 28el corresponding to the subpixels SP in the nth column. Further, the gate wiring line 28gl whose reference numeral is added with (n−1) is the gate wiring line 28gl that is scanned immediately before the gate wiring line 28gl in the n-th column.

In the first initialization transistor 50A, the threshold value compensation transistor 50B, the write control transistor 50C, the drive transistor 50D, the power supply transistor 50E, the light emission control transistor 50F, and the second initialization transistor 50G that constitute the pixel circuit Pc, a control terminal Ct corresponds to the gate electrode 28ge, and one terminal of a first conduction terminal Na and a second conduction terminal Nb corresponds to the source region of the semiconductor layer 24 or the conduction electrode 36sd connected to the source region, and the other terminal corresponds to the drain region of the semiconductor layer 24 or the conduction electrode 36sd connected to the drain region.

The first initialization transistor 50A is provided between the gate wiring line 28gl(n−1), the initialization power source wiring line 32il, and the capacitor 52. The control terminal Ct of the first initialization transistor 50A is connected to the gate wiring line 28gl(n−1). The first conduction terminal Na of the first initialization transistor 50A is connected to the initialization power source wiring line 32il. The second conduction terminal Nb of the first initialization transistor 50A is connected to the capacitor 52 (the first capacitance electrode 28ce). The first initialization transistor 50A initializes a voltage applied to the control terminal Ct of the drive transistor 50D by applying a voltage of the initialization power source wiring line 32il to the capacitor 52 in response to the selection of the gate wiring line 28gl(n−1).

The threshold value compensation transistor 50B is provided between the gate wiring line 28gl(n−1) and the drive transistor 50D. The control terminal Ct of the threshold value compensation transistor 50B is connected to the gate wiring line 28gl(n). The first conduction terminal Na of the threshold value compensation transistor 50B is connected to the second conduction terminal Nb of the drive transistor 50D. The second conduction terminal Nb of the threshold value compensation transistor 50B is connected to the control terminal Ct of the drive transistor 50D. The threshold value compensation transistor 50B brings the drive transistor 50D into a diode-connected state in response to the selection of the gate wiring line 28gl (n), and compensates a threshold value voltage of the drive transistor 50D.

The write control transistor 50C is provided between the gate wiring line 28gl(n), the source wiring line 36sl, and the drive transistor 50D. The control terminal Ct of the write control transistor 50C is connected to the gate wiring line 28gl(n). The first conduction terminal Na of the write control transistor 50C is connected to the source wiring line 36sl. The second conduction terminal Nb of the write control transistor 50C is connected to the first conduction terminal Na of the drive transistor 50D. The write control transistor 50C applies a voltage of the source wiring line 36sl to the first conduction terminal Na of the drive transistor 50D in response to the selection of the gate wiring line 28gl(n).

The drive transistor 50D is provided between the first initialization transistor 50A, the threshold value compensation transistor 50B, the capacitor 52, the write control transistor 50C, the power supply transistor 50E, and the light emission control transistor 50F. The control terminal Ct of the drive transistor 50D is connected to the second conduction terminal Nb of the first initialization transistor 50A and the second conduction terminal Nb of the threshold value compensation transistor 50B. The first conduction terminal Na of the drive transistor 50D is connected to the second conduction terminal Nb of the write control transistor 50C and the second conduction terminal Nb of the power supply transistor 50E. The second conduction terminal Nb of the drive transistor 50D is connected to the first conduction terminal Na of the threshold value compensation transistor SOB and the first conduction terminal Na of the light emission control transistor 50F. The drive transistor 50D applies a drive current corresponding to a voltage applied between the control terminal Ct of its own element and the first conduction terminal Na, to the first conduction terminal Na of the light emission control transistor 50F.

The power supply transistor 50E is provided between the emission control wiring line 28el (n), the power source wiring line Pl, and the drive transistor 50D. The control terminal Ct of the power supply transistor 50E is connected to the emission control wiring line 28el. The first conduction terminal Na of the power supply transistor 50E is connected to the power source wiring line Pl. The second conduction terminal Nb of the power supply transistor 50E is connected to the first conduction terminal Na of the drive transistor 50D. The power supply transistor 50E applies a potential of the power source wiring line Pl to the first conduction terminal Na of the drive transistor 50D in response to the selection of the emission control wiring line 28el.

The light emission control transistor 50F is provided between the emission control wiring line 28el, the threshold value compensation transistor 50B, the drive transistor 50D, and the organic EL element 70. The control terminal Ct of the light emission control transistor 50F is connected to the emission control wiring line 28el(n). The first conduction terminal Na of the light emission control transistor 50F is connected to the second conduction terminal Nb of the drive transistor 50D. The second conduction terminal Nb of the light emission control transistor 50F is connected to the organic EL element 70 (first electrode 62fe). The light emission control transistor 50F applies a drive current to the organic EL element 70 in response to the selection of the emission control wiring line 28el.

The second initialization transistor 50G is provided between the gate wiring line 28gl(n), the initialization power source wiring line 32il, and the organic EL element 70. The control terminal Ct of the second initialization transistor 50G is connected to the gate wiring line 28gl(n). The first conduction terminal Na of the second initialization transistor 50G is connected to the organic EL element 70 (first electrode 62fe). The second conduction terminal Nb of the second initialization transistor 50G is connected to the initialization power source wiring line 32il. The second initialization transistor 50G resets charges accumulated in the first electrode 62fe of the organic EL element 70 in response to the selection of the gate wiring line 28gl(n).

The capacitor 52 is provided between the power source wiring line Pl, the first initialization transistor 50A, and the drive transistor 50D. One electrode (the first capacitance electrode 28ce) of the capacitor 52 is connected to the control terminal Ct of the drive transistor 50D, the second conduction terminal Nb of the first initialization transistor 50A, and the second conduction terminal Nb of the threshold value compensation transistor 50B. The other electrode (the second capacitance electrode 32ce) of the capacitor 52 is connected to the power source wiring line Pl. The capacitor 52 holds a voltage written by accumulating the charges to maintain the voltage applied to the control terminal Ct of the drive transistor 50D when the gate wiring line 28gl(n) is in a non-select state.

Sealing Film

The sealing film 80 is provided to cover the plurality of organic EL elements 70. The sealing film 80 protects the organic EL layer 66 of each of the organic EL elements 70 from moisture, oxygen, or the like. The sealing film 80 is covered with a surface protection film (not illustrated). The sealing film 80 includes a first inorganic layer 82, an organic layer 84, and a second inorganic layer 86 that are provided in order on the fifth conductive layer 68.

The first inorganic layer 82 covers the second electrode 68se, together with the first dam wall Wa and the second dam wall Wb. The organic layer 84 is provided at the inner side of the first dam wall Wa. The organic layer 84 may also be present between the first dam wall Wa and the second dam wall Wb. The second inorganic layer 86 covers the organic layer 84 and extends to the outer peripheral side of the second dam wall Wb. The peripheral end edge portions of the first inorganic layer 82 and the second inorganic layer 86 are bonded to each other at the outer peripheral side than the first dam wall Wa.

The organic layer 84 is encased by the first inorganic layer 82 and the second inorganic layer 86, and is encapsulated between the first inorganic layer 82 and the second inorganic layer 86. For example, the first inorganic layer 82 and the second inorganic layer 86 are constituted by an inorganic insulating film such as a silicon oxide film, a silicon nitride film, a silicon oxynitride film and the like. For example, the organic layer 84 is formed of an organic material such as acrylic resin, epoxy resin, silicone resin, polvurea resin, parylene resin, polyimide resin, and polyamide resin.

Operation of Organic EL Display Device

In the organic EL display device 1, first, in each of the subpixels SP, the organic EL element 70 is brought into a non-light emission state when the corresponding emission control wiring line 28el is selected to be in an inactive state. Then, when the gate wiring line 28gl to be scanned immediately before the gate wiring line 28gl corresponding to the organic EL element 70 in the non-light emission state is selected, a gate signal is input to the first initialization transistor 50A through that gate wiring line 28gl, the first initialization transistor 50A and the drive transistor 50D are brought into an on state, and an initialization potential from the initialization power source wiring line 32il is applied to the capacitor 52. Thus, the charges of the capacitor 52 are discharged, and the voltage applied to the gate electrode 28ge of the drive transistor 50D is initialized.

Subsequently, when the gate wiring line 28gl corresponding to the organic EL element 70 in the non-light emission state is selected to be in an active state, the threshold value compensation transistor 50B and the write control transistor 50C are brought into the on state, and a predetermined voltage corresponding to a source signal is written from the source wiring line 36sl to the capacitor 52 via the drive transistor 50D being in a diode-connected state. Further, the second initialization transistor 50G is brought into the on state, the initialization potential from the initialization power source wiring line 32il is applied to the first electrode 62fe of the organic EL element 70, and the charges accumulated in the first electrode 62fe is reset.

Thereafter, when the emission control wiring line 28el corresponding to the organic EL element 70 being in the non-light emission state is unselected to be in the active state, the power supply transistor 50E and the light emission control transistor 50F are brought into the on state, and a drive current corresponding to the voltage applied to the gate electrode 28ge of the drive transistor 50D is supplied from the power source wiring line Pl to the organic EL element 70. In this way, each of the organic EL elements 70 emits light at a luminance corresponding to the drive current. In the organic EL display device 1, the luminance of each subpixel SP is adjusted by such light emission of each of the organic EL elements 70, and thus, an image is displayed in the display region D.

Manufacturing Method of Organic EL Display Device

Figure 10:
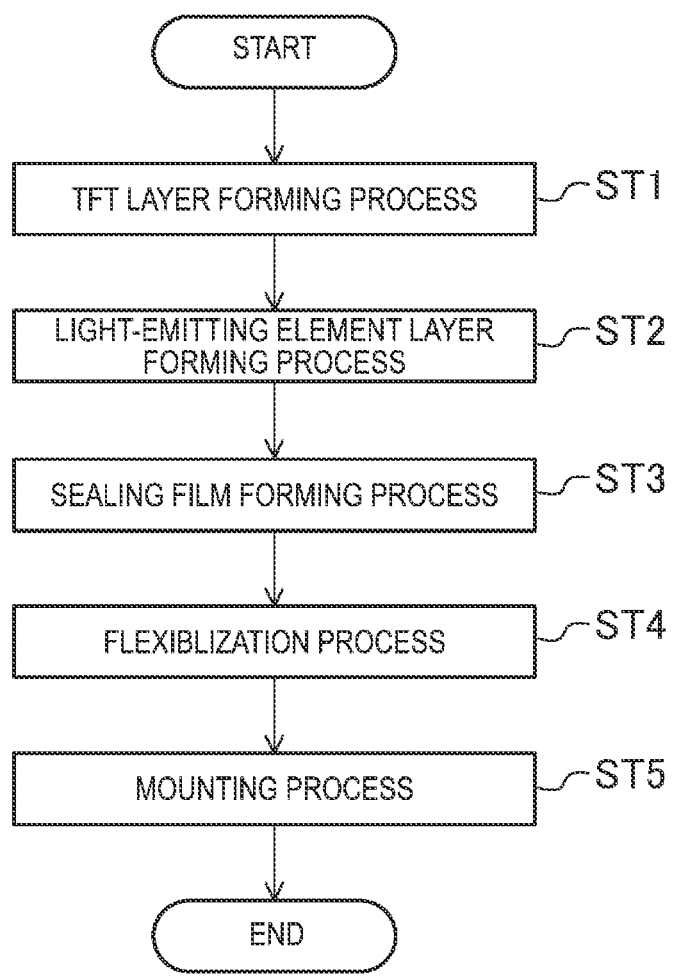
FIG. 10 is a flowchart schematically illustrating a manufacturing method of the organic EL display device according to the first embodiment.

A manufacturing method of the organic EL display device 1 according to the present embodiment will be described below. FIG. 10 is a flowchart schematically illustrating manufacturing method of the organic EL display device 1.

As illustrated in FIG. 10, the manufacturing method of the organic EL display device 1 includes a TFT layer forming process ST1, a light-emitting element layer forming process ST2, a sealing film forming process ST3, a flexibilization process ST4, and a mounting process ST5.

TFT Layer Forming Process

Figure 11:
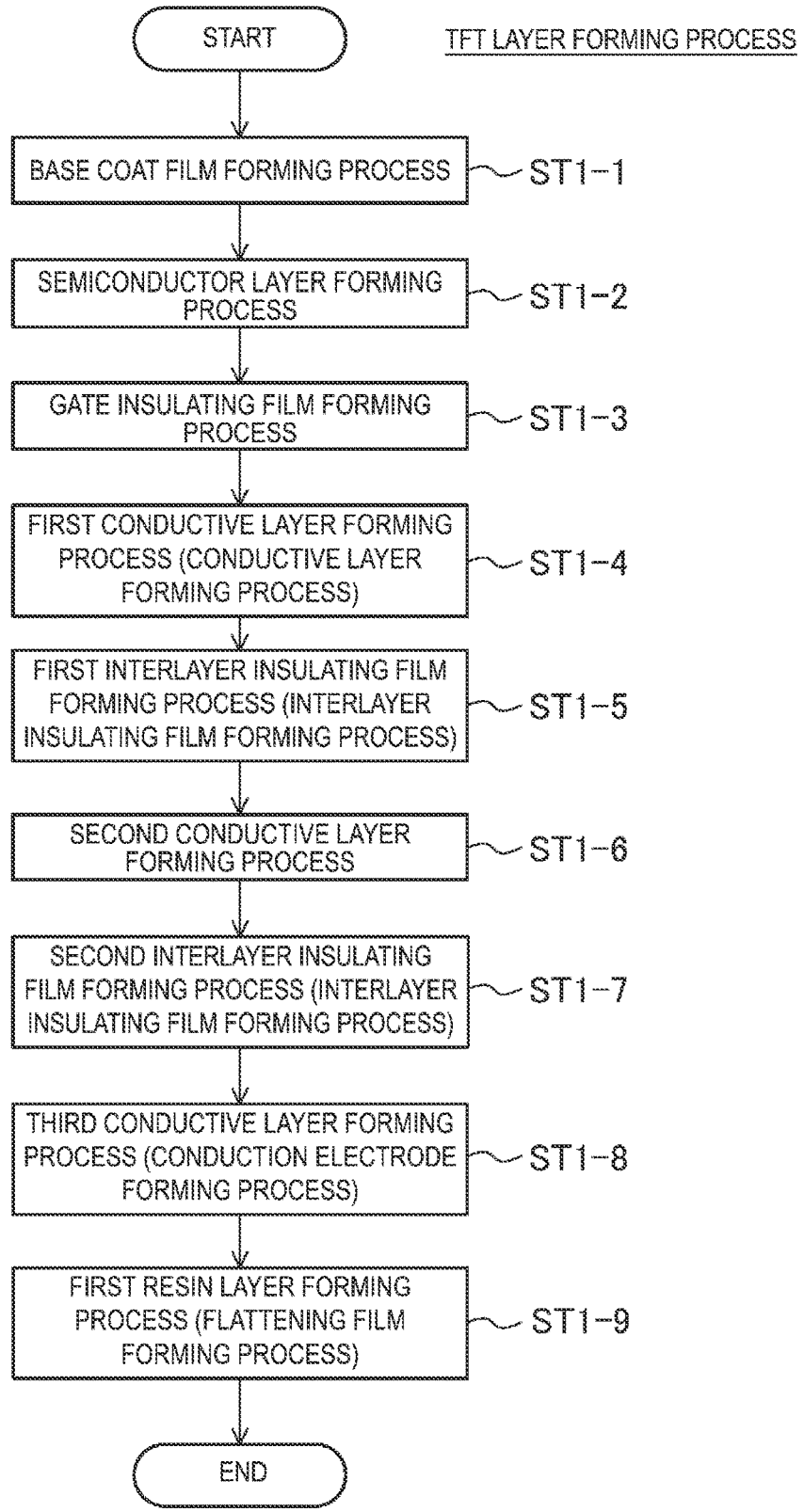
FIG. 11 is a flowchart schematically illustrating a forming process of a TFT layer in the manufacturing method of the organic EL display device according to the first embodiment.

FIG. 11 is a flowchart schematically illustrating the TFT layer forming process ST1. As illustrated in FIG. 11, the TFT layer forming process ST1 includes a base coat film forming process ST1-1, a semiconductor layer forming process ST1-2, a gate insulating film forming process ST1-3, a first conductive layer forming process ST1-4, a first interlayer insulating film forming process ST1-5, a second conductive layer forming process ST1-6, a second interlayer insulating film forming process ST1-7, a third conductive layer forming process ST1-8, and a first resin layer forming process ST1-9.

In the TFT layer forming process ST1, first, the resin substrate layer 10 is formed on the surface of a glass substrate 100, for example, by applying a resin material. In the base coat film forming process ST1-1, which is performed as the next process, film forming is performed such that an inorganic insulating film is formed as a single layer or a plurality of inorganic insulating films are layered on the resin substrate layer 10 formed on the surface of the glass substrate 100 by, for example, a plasma Chemical Vapor Deposition (CVD) method to form the base coat film 22.

In the semiconductor layer forming process ST1-2, which is performed as the next process, a semiconductor film is formed on the substrate on which the base coat film 22 has been formed, for example, by a sputtering method. The semiconductor film is then subjected to resistance-lowering processing as necessary, After that, the semiconductor film is patterned by photolithography to form the semiconductor layer 24.

In the gate insulating film forming process ST1-3, which is performed as the next process, film forming is performed such that an inorganic insulating film is formed as a single layer or a plurality of inorganic insulating films are layered on the substrate formed with the semiconductor layer 24, for example, by a plasma CVD method. Then, the inorganic insulating film is patterned by photolithography to form the gate insulating film 26.

Figure 12:
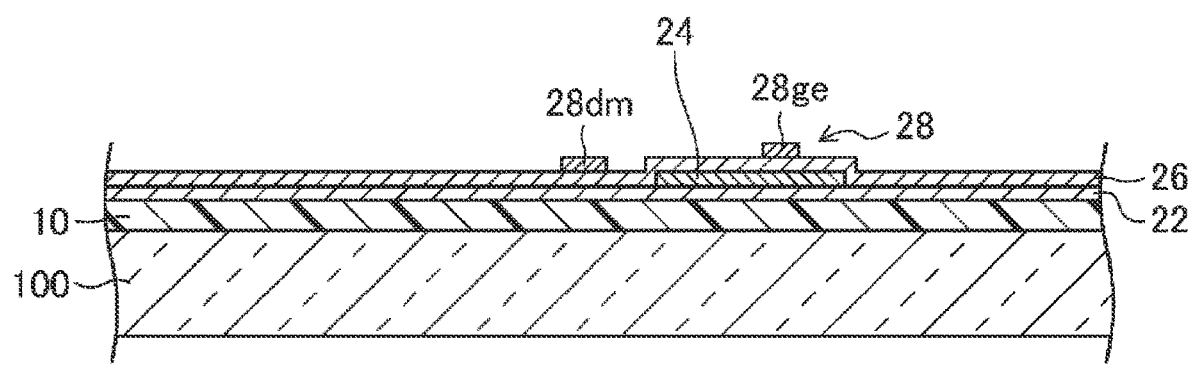
FIG. 12 is a cross-sectional view illustrating a main portion of a substrate in a state in which a forming process of a first conductive layer has been performed in the manufacturing method of the organic EL display device according to the first embodiment.

FIG. 12 is a cross-sectional view illustrating a main portion of the substrate in a state where the first conductive layer forming process ST1-4 has been performed. In the first conductive layer forming process ST1-4, which is performed as the next process, film forming is performed such that a metal film is formed as a single layer or a plurality of metal films are layered on the substrate formed with the gate insulating film 26, for example, by a sputtering method to form a conductive film. Subsequently, the conductive film is patterned by photolithography, as illustrated in FIG. 12, to form the first conductive layer 28 (the plurality of gate electrodes 28ge, the plurality of emission control wiring lines 28el, the plurality of first partial wiring lines 28al, the plurality of gate wiring lines 28gl, the plurality of first capacitance electrodes 28ce, and the plurality of dummy electrodes 28dm). In the first conductive layer forming process ST1-4, each dummy electrode 28dm is formed, in a plan view, at a position overlapping the first electrode 62fe, the contact hole 38h of the flattening film 38pf, and the conduction electrode 36sd, which will be formed later. The first conductive layer forming process ST1-4 corresponds to the conductive layer forming process.

Figure 13:
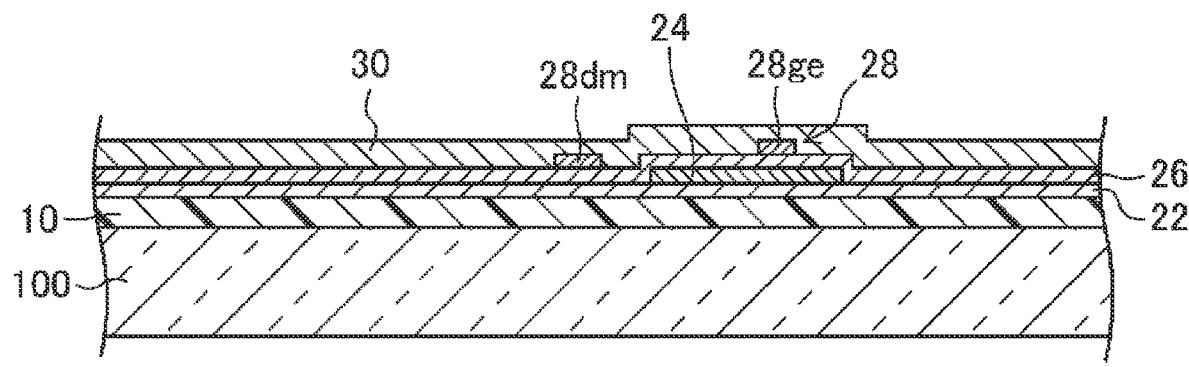
FIG. 13 is a cross-sectional view illustrating the main portion of the substrate in a state where a forming process of a first interlayer insulating film has been performed in the manufacturing method of the organic EL display device according to the first embodiment.

FIG. 13 is a cross-sectional view illustrating the main portion of the substrate in a state where the first interlayer insulating film forming process ST1-5 has been performed. In the first interlayer insulating film forming process ST1-5, which is performed as the next process, film forming is performed such that an inorganic insulating film is formed as a single layer or a plurality of inorganic insulating films are layered on the substrate formed with the first conductive layer 28, for example, by a plasma CVD method to form the first interlayer insulating film 30, as illustrated in FIG. 13.

In the second conductive layer forming process ST1-6, which is performed as the next process, film forming is performed such that a metal film is formed as a single layer or a plurality of metal films are layered on the substrate formed with the first interlayer insulating film 30, for example, by a sputtering method to form a conductive film. Subsequently, the conductive film is patterned by photolithography to form the second conductive layer 32 (the plurality of initialization power source wiring lines 32il, the plurality of first power source wiring lines 32pl, and the plurality of second capacitance electrodes 32ce).

Figure 14:
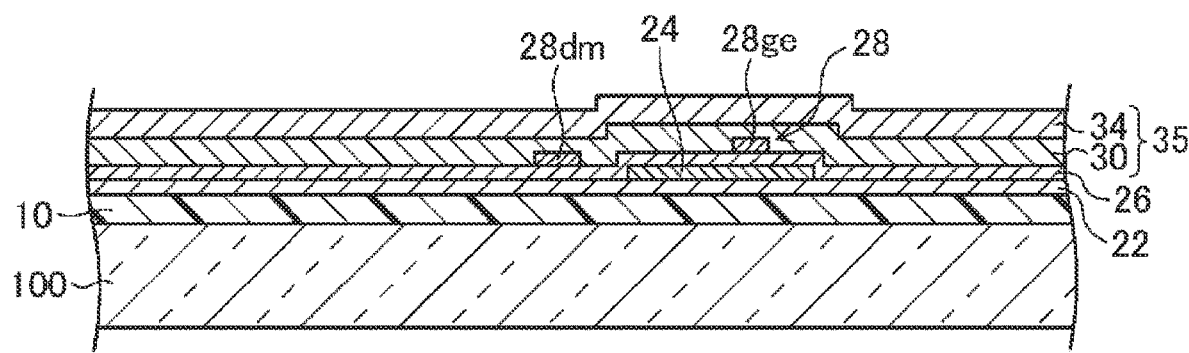
FIG. 14 is a cross-sectional view illustrating the main portion of the substrate in a state where a forming process of a second interlayer insulating film has been performed in the manufacturing method of the organic EL display device according to the first embodiment.

FIG. 14 is a cross-sectional view illustrating the main portion of the substrate in a state where the second interlayer insulating film forming process ST1-7 has been performed. In the second interlayer insulating film forming process ST1-7, which is performed as the next process, film forming is performed such that an inorganic insulating film is formed as a single layer or a plurality of inorganic insulating films are layered on the substrate formed with the second conductive layer 32, for example, by a plasma CVD method to form the second interlayer insulating film 34, as illustrated in FIG. 14. Then, the interlayer insulating film 35 constituted by the first interlayer insulating film 30 and the second interlayer insulating film 34 and the gate insulating film 26 are patterned by photolithography to form the contact hole 37 or the like. At this time, the interlayer insulating film 30, the gate insulating film 26, and the base coat film 22 that are positioned at a portion constituting the bending portion B may be simultaneously removed. The second interlayer insulating film forming process ST1-5, in combination with the first interlayer insulating film forming process ST1-3, corresponds to the interlayer insulating film forming process.

Figure 15:
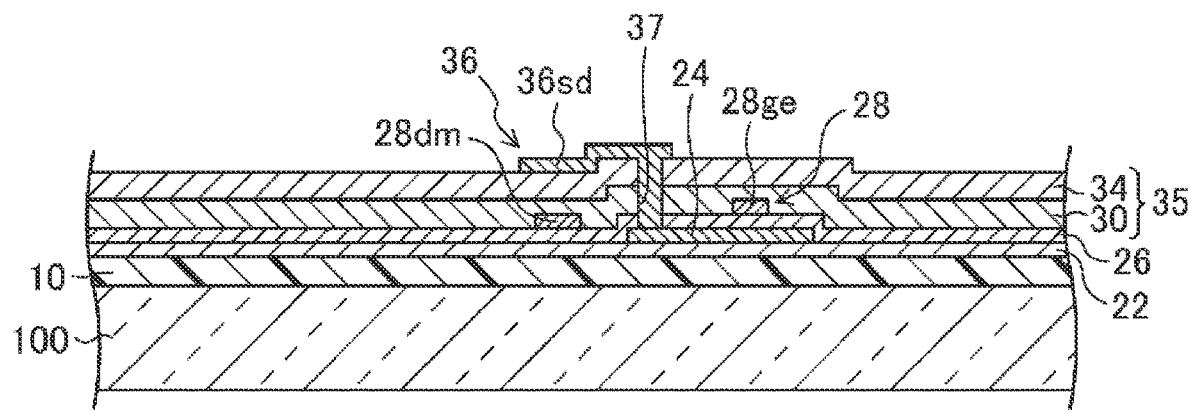
FIG. 15 is a cross-sectional view illustrating the main portion of the substrate in a state where a forming process of a third conductive layer has been performed in the manufacturing method of the organic EL display device according to the first embodiment.

FIG. 15 is a cross-sectional view illustrating the main portion of the substrate in a state where the third conductive layer forming process ST1-8 has been performed. In the third conductive layer forming process ST1-8, which is performed as the next process, film forming is performed such that a metal film is formed as a single layer or a plurality of metal films being layered on the substrate formed with the second interlayer insulating film 34, for example, by a sputtering method to form a conductive film. Subsequently, the conductive film is patterned by photolithography, as illustrated in FIG. 15, to form the third conductive layer 36 (the plurality of source wiring lines 36sl, the plurality of second power source wiring lines 36pl, the plurality of second partial wiring lines 36bl, the first frame wiring line 36fa, the second frame wiring line 36fb, and the plurality of conduction electrodes 36*sd*). The third conductive layer forming process ST1-8 corresponds to the conduction electrode forming process.

Figure 16:
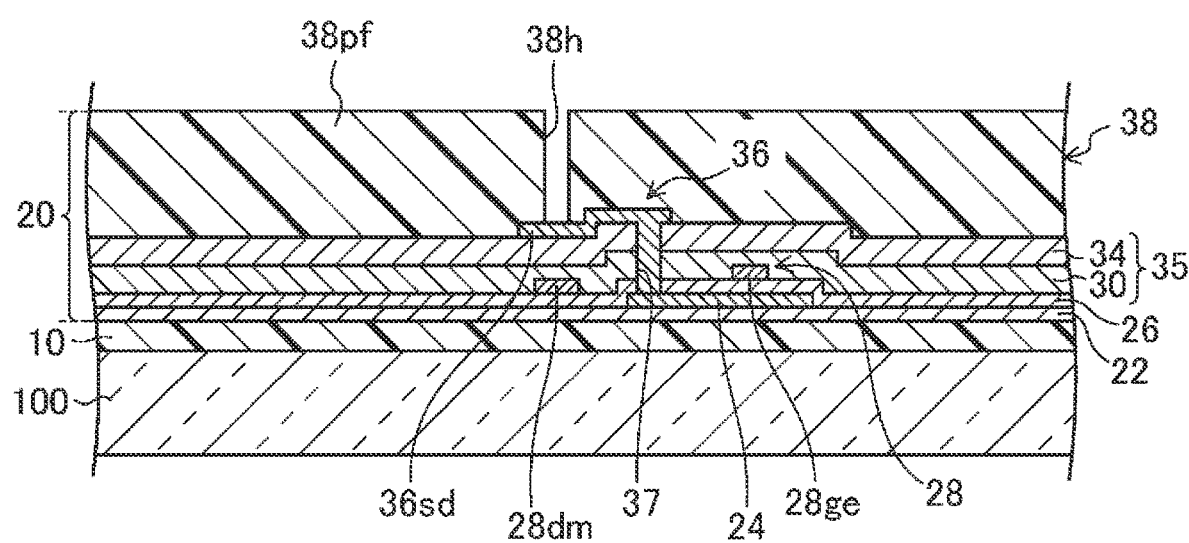
FIG. 16 is a cross-sectional view illustrating the main portion of the substrate in a state where a forming process of a first resin layer has been performed in the manufacturing method of the organic EL display device according to the first embodiment.

FIG. 16 is a cross-sectional view illustrating the main portion of the substrate in a state where the first resin layer forming process ST1-9 has been performed. In the first resin layer forming process ST1-9, which is performed as the next process, a photosensitive resin material is applied on the substrate formed with the third conductive layer 36, for example, by a publicly known coating method such as a spin coating method. Subsequently, as illustrated in FIG. 16, the first resin layer 38 (the flattening film 38*pf* and the first wall layer) is formed by performing prebaking, exposure processing, developing processing, and postbaking on a coating film formed of the photosensitive resin material, and patterning the coating film. In the first resin layer forming process ST1-9, the flattening film 38*pf* formed with the contact hole 38*h* that exposes each conduction electrode 36*sd* to the bottom thereof is formed so as to cover the plurality of source wiring lines 36*sl*, the plurality of second power source wiring lines 36*pl*, the plurality of second partial wiring lines 36*bl*, the first frame wiring line 36*fa*, the second frame wiring line 36*fb*, and the plurality of conduction electrodes 36*sd*. The first resin layer forming process ST1-9 corresponds to the flattening film forming process.

In this way, in the TFT layer forming process ST1, the TFT layer 20 including the plurality of TFTs 50 is formed on the resin substrate layer 10.

Light-Emitting Element Layer Forming Process

Figure 17:
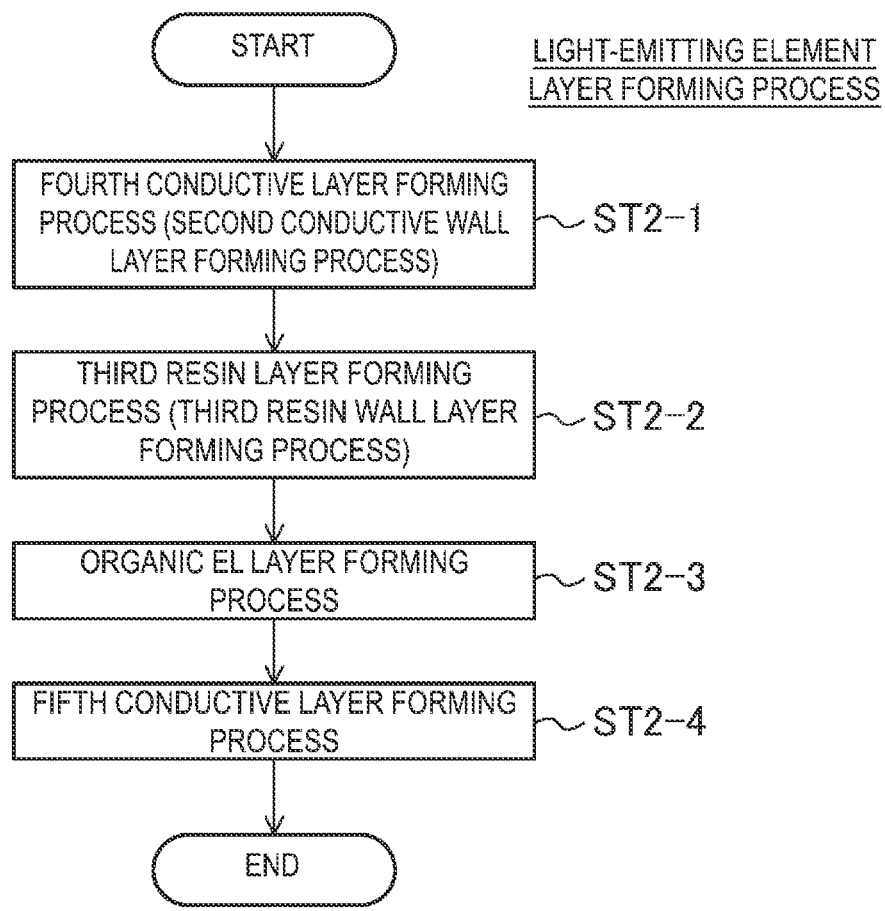
FIG. 17 is a flowchart schematically illustrating a forming process of a light-emitting element layer in the manufacturing method of the organic EL display device according to the first embodiment.

FIG. 17 is a flowchart schematically illustrating the light-emitting element layer forming process ST2. As illustrated in FIG. 17, the light-emitting element layer forming process ST2 includes a fourth conductive layer forming process (a second conductive wall layer forming process) ST2-1, a second resin layer forming process (a third resin wall layer forming process) ST2-2, an organic EL layer forming process ST2-3, and a fifth conductive layer forming process ST2-4.

Figure 18:
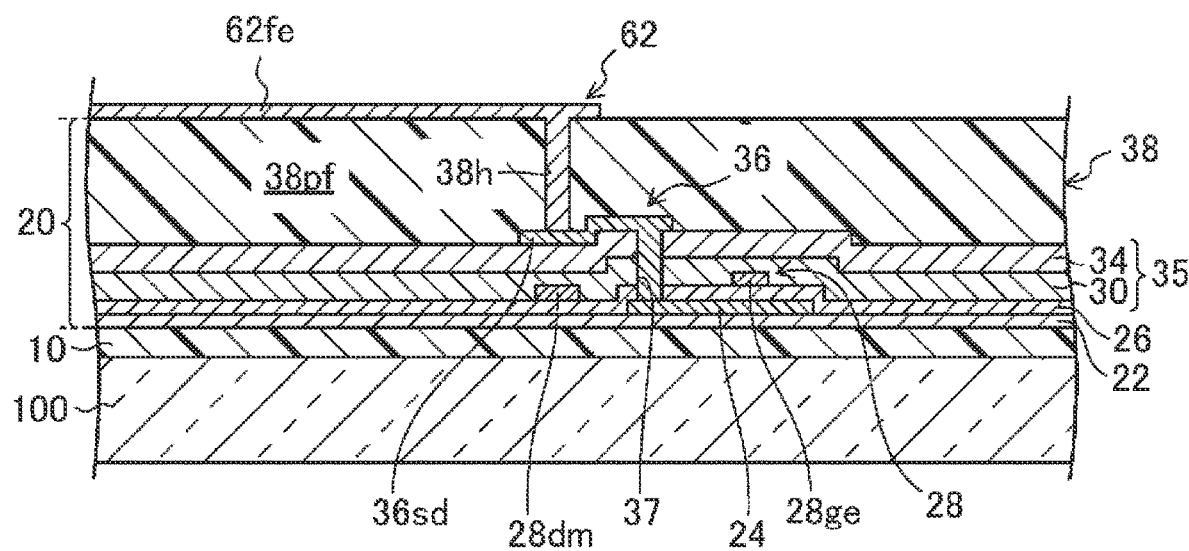
FIG. 18 is a cross-sectional view illustrating the main portion of the substrate in a state where a forming process of a fourth conductive layer has been performed in the manufacturing method of the organic EL display device according to the first embodiment.

FIG. 18 is a cross-sectional view illustrating the main portion of the substrate in a state where the fourth conductive layer forming process ST2-1 has been performed. Further, in the fourth conductive layer forming process ST2-1, film forming is performed such that a conductive oxide film or a metal film is formed as a single layer or a plurality of conductive oxide films or metal films being layered on the substrate formed with the TFT layer 20, for example, by a sputtering method, to form a conductive film. Subsequently, the conductive film is patterned by photolithography, as illustrated in FIG. 18, to form the fourth conductive layer 62 (the plurality of first electrodes 62*fe*). In the fourth conductive layer forming process ST2-1, the first electrode 62*fe* is formed for each organic EL element 70 so as to be connected to the conduction electrode 36*sd* through the contact hole 38*h* formed in the flattening film 38*pf*. The fourth conductive layer forming process ST2-1 corresponds to the first electrode forming process.

Figure 19:
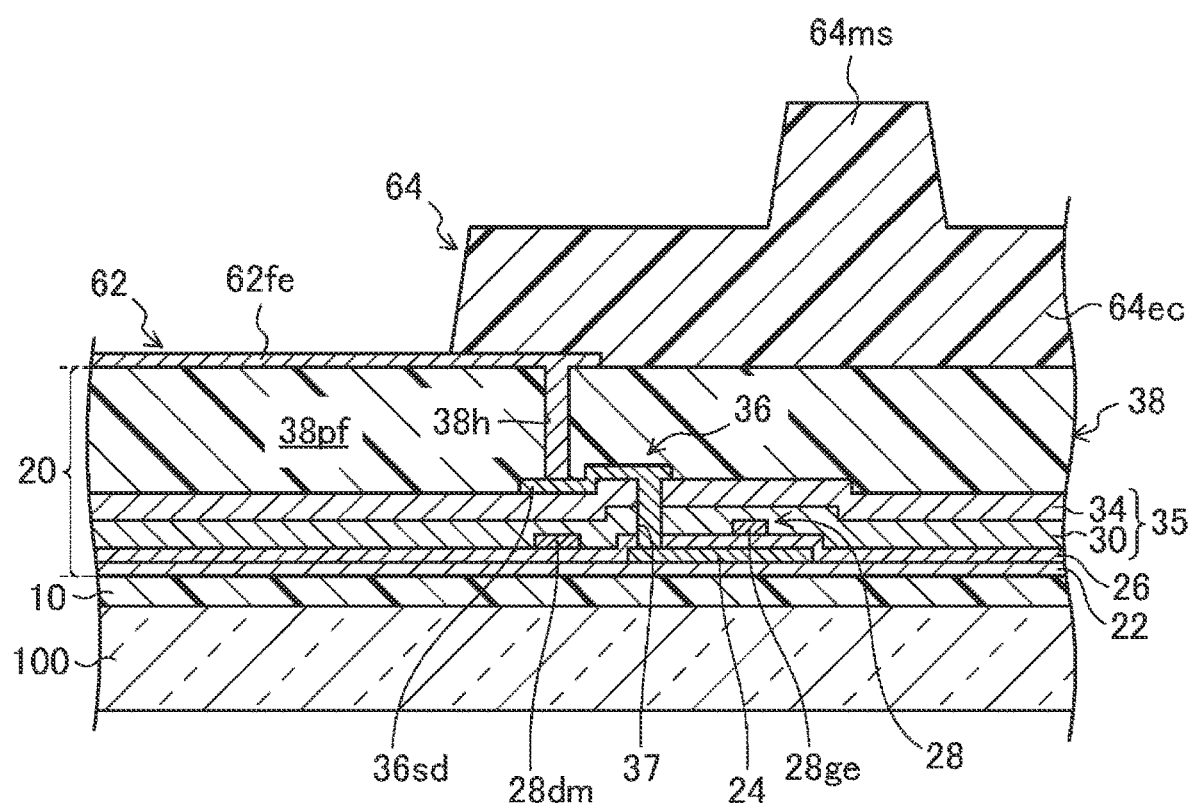
FIG. 19 is a cross-sectional view illustrating the main portion of the substrate in a state where a forming process of a second resin layer has been performed in the manufacturing method of the organic EL display device according to the first embodiment.

FIG. 19 is a cross-sectional view illustrating the main portion of the substrate in a state where the second resin layer forming process ST2-2 has been performed. In the second resin layer forming process ST2-2, which is performed as the next process, a photosensitive resin material is applied on the substrate formed with the fourth conductive layer 62, for example, by a publicly known coating method such as a spin coating method. Subsequently, as illustrated in FIG. 19, the second resin layer 64 (the edge cover 64*ec*, the mask spacer 64*ms*, and the second wall layer) is formed by performing prebaking, exposure processing, developing processing, and postbaking on a coating film formed of the photosensitive resin material, and patterning the coating film. In the second resin layer forming process ST2-2, the mask spacers 64*ms* are formed around some first electrodes 62*fe* among the plurality of first electrodes 62*fe*. The second resin layer forming process ST2-2 corresponds to the mask spacer forming process.

Figure 20:
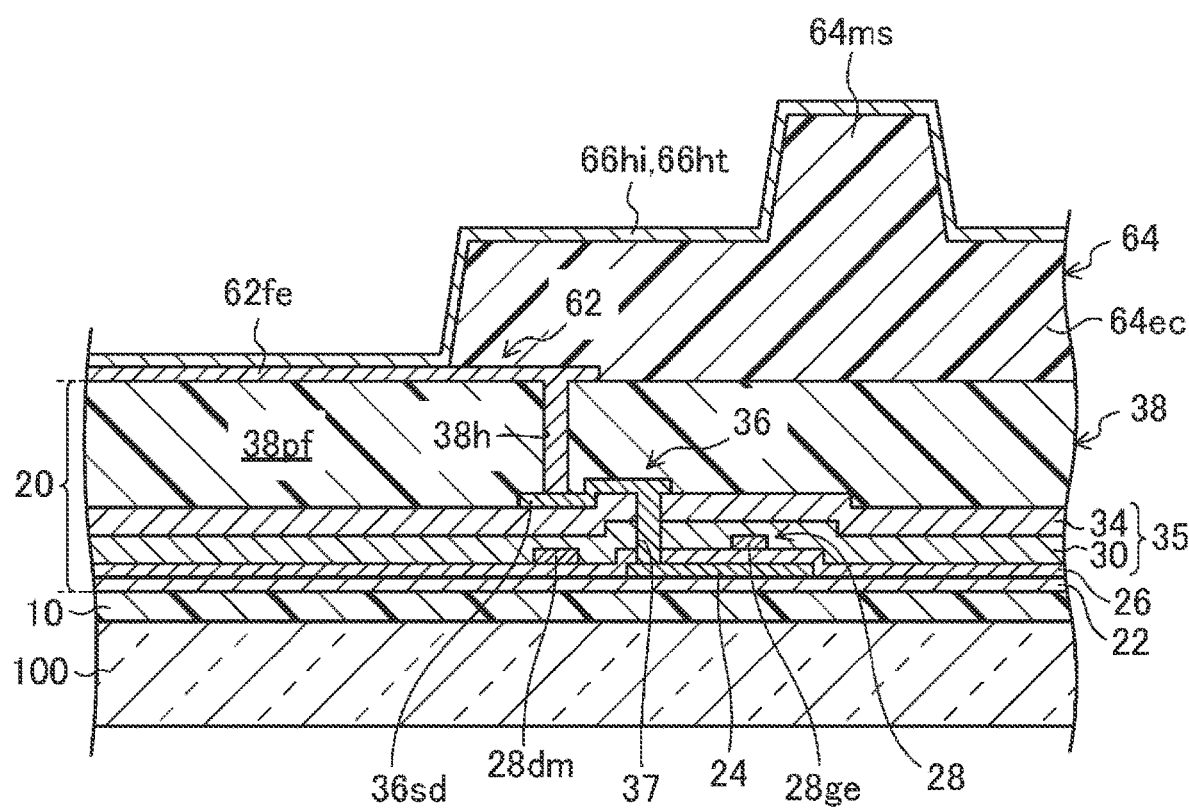
FIG. 20 is a cross-sectional view illustrating the main portion of the substrate in a state where a hole injection layer and a hole transport layer have been formed in a forming process of an organic EL layer in the manufacturing method of the organic EL display device according to the first embodiment.

FIG. 20 is a cross-sectional view illustrating the main portion of the substrate in a state where the hole injection layer 66*hi* and the hole transport layer 66*ht* are formed in the organic EL layer forming process ST2-3. In the organic EL layer forming process ST2-3, which is performed as the next process, film forming is performed on the substrate formed with the second resin layer 64 by using a film-forming mask that is called a Common Metal Mask (CMM) and that is provided with a plurality of openings that can be patterned in units of display panel, for example, by a vacuum vapor deposition technique, as illustrated in FIG. 20, to form the hole injection layer 66*hi* and the hole transport layer 66*ht* in order. In the organic EL layer forming process ST2-3, the hole injection layer 66*hi* and the hole transport layer 66*ht* are formed to cover the plurality of first electrodes 62*fe*, the edge cover 62*ec*, and the mask spacers 64*ms*.

Figure 21:
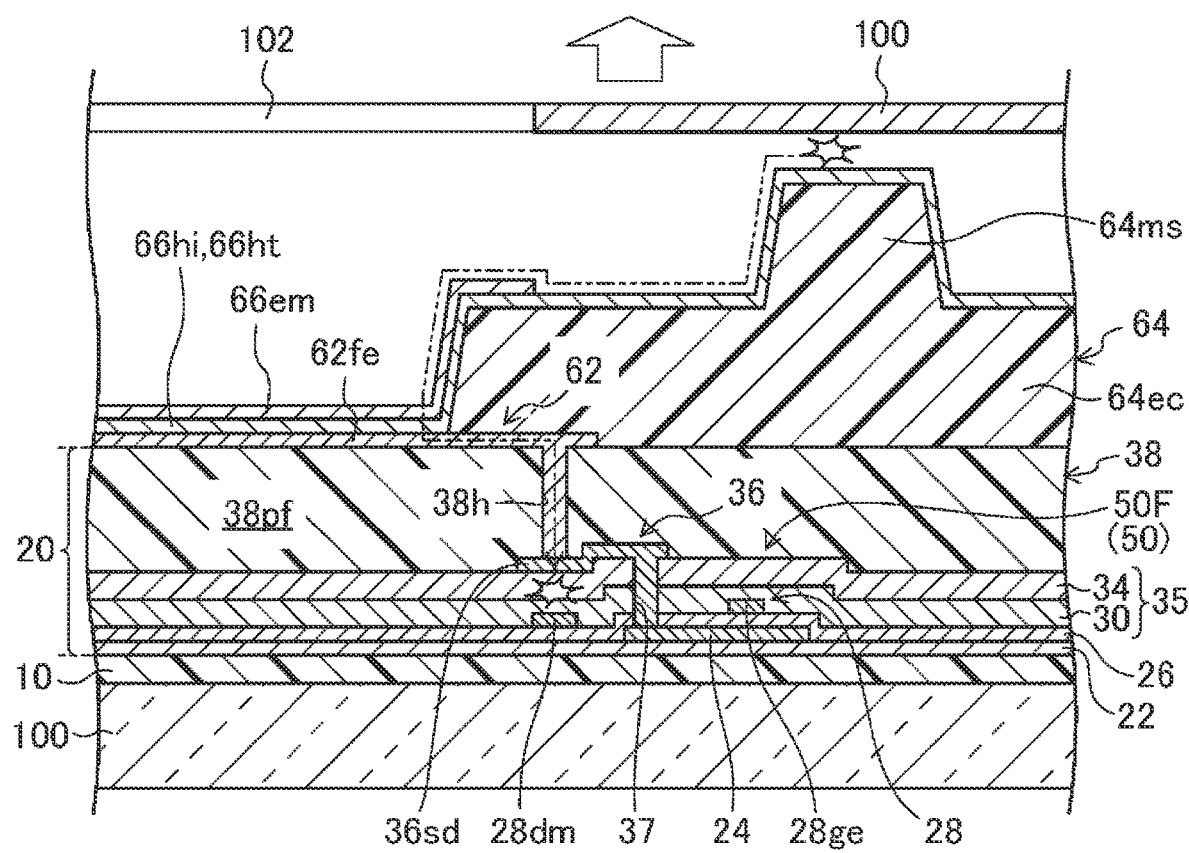
FIG. 21 is a cross-sectional view illustrating the main portion of the substrate in a state where a light-emitting layer has been formed in the forming process of the organic EL layer in the manufacturing method of the organic EL display device according to the first embodiment.

FIG. 21 is a cross-sectional view illustrating the main portion of the substrate in a state where the light-emitting layer 66*em* has been formed in the organic EL layer forming process ST2-3. Subsequently, as illustrated in FIG. 21, film forming is performed on the substrate formed with the hole transport layer 66*ht* by using the film-forming mask 100 that is called a Fine Metal Mask (FMM) and that is provided with a plurality of openings 102 that can be patterned in units of subpixel, for example, by a vacuum vapor deposition technique to form the light-emitting layer 66*em*. The film-forming mask 100 used in forming the light-emitting layer 66*em* comes into contact with the mask spacer 64*ms*, and is held in a state of being separated from the surface of a vapor deposition target for forming the light-emitting layer 66*em*. Then, when the light-emitting layer 66*em* is formed and the film-forming mask 100 is separated from the mask spacer 64*ms*, peeling electrification may occur between the film-forming mask 100 and the mask spacer 64*ms*.

At this time, since the mask spacer 64*ms* is covered by the previously formed hole injection layer 66*hi* and hole transport layer 66*ht*, the first electrode 62*fe* is charged through the hole injection layer 66*hi* and the hole transport layer 66*ht* (refer to the path of charging indicated by the dashed-two dotted line in FIG. 21). Due to this, when electrostatic discharge occurs between the conduction electrode 36*sd* of the light emission control transistor 50F and the emission control wiring line 28*el*, a discharged current is transmitted through the emission control wiring line 28*el*, and an electric element of the emission driver Ed connected with the emission control wiring line 28*el* is broken. However, the dummy electrode 28*dm* is positioned closer to the conduction electrode 36*sd* of the light emission control transistor 50F than the emission control wiring line 28*el*, and thus, Electro Static Discharge (ESD) can be caused to occur between the conduction electrode 36*sd* of the light emission control transistor 50F and the dummy electrode 28*dm*.

Figure 22:
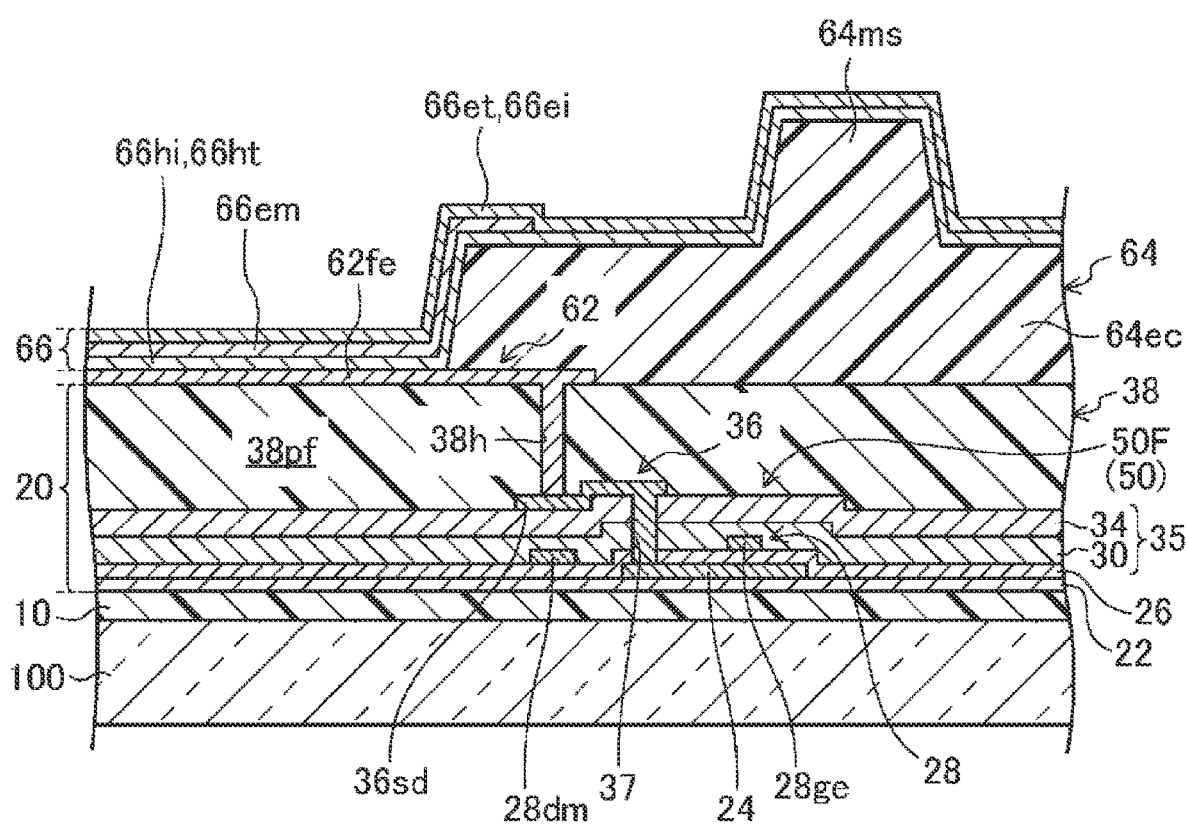
FIG. 22 is a cross-sectional view illustrating the main portion of the substrate in a state where an electron transport layer and an electron injection layer have been formed in the forming process of the organic EL layer in the manufacturing method of the organic EL display device according to the first embodiment.

FIG. 22 is a cross-sectional view illustrating the main portion of the substrate in a state where the electron transport layer 66*et* and the electron injection layer 66*ei* have been formed in the organic EL layer forming process ST2-2. Thereafter, film forming is performed on the substrate formed with the light-emitting layer 66*cm* by using a film-forming mask (CMM), for example, by a vacuum vapor deposition technique, and as illustrated in FIG. 22, the electron transport layer 66*eh* and the electron injection layer 66*ei* are formed in order. Thus, the organic EL layer 66 is formed on the individual first electrode 62*fe* inside the opening 64*o* of the edge cover 64*ec*. Here, the organic EL layer forming process ST2-2 corresponds to the light-emitting function layer forming process.

Figure 23:
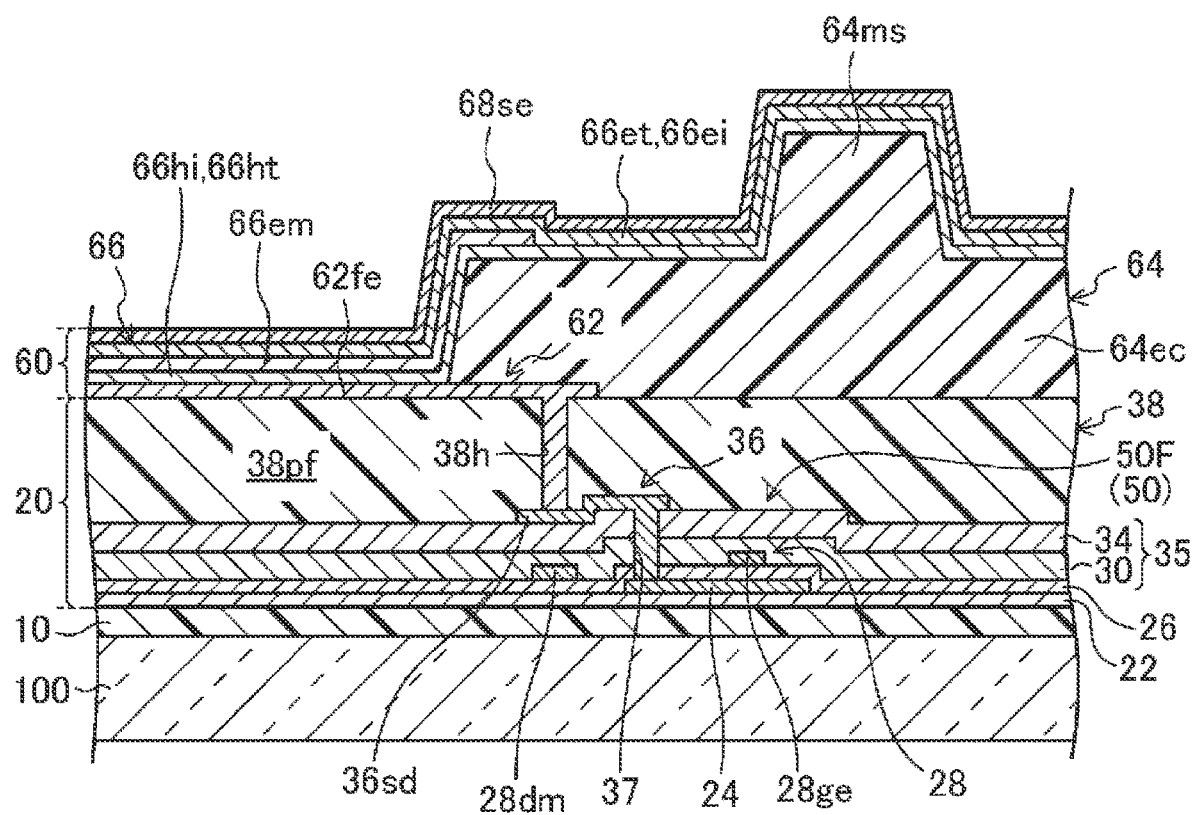
FIG. 23 is a cross-sectional view illustrating the main portion of the substrate in a state where a forming process of a fifth conductive layer has been performed in the manufacturing method of the organic EL display device according to the first embodiment.

FIG. 23 is a cross-sectional view illustrating the main portion of the substrate in a state where the fifth conductive layer 68 has been formed in the fifth conductive layer forming process ST2-3. In the fifth conductive layer forming process ST2-3, which is performed as the next process, film forming is performed such that a metal film is formed as a single layer or a plurality of metal films are layered on the substrate formed with the organic EL layer 66 by using a film-forming mask (CMM), for example, by a vacuum vapor deposition technique, as illustrated in FIG. 23, to form the fifth conductive layer 68 (the second electrode 68*se*). In the fifth conductive layer forming process ST1-3, the second electrode 68*se* is formed so as to overlap each of the plurality of first electrodes 62*fe* with the organic EL layer 66 interposed therebetween. The fifth conductive layer forming process ST2-3 corresponds to the second electrode forming process.

In this way, in the light-emitting element layer forming process ST2, the light-emitting element layer 60 including the plurality of organic EL elements 70 is formed on the TFT layer 20.

Sealing Film Forming Process

In the sealing film forming process ST3, film forming is performed such that an inorganic insulating film is formed as a single layer or a plurality of inorganic insulating films are layered on the substrate formed with the light-emitting element layer 60 by using a film-forming mask (CMM), for example, by a plasma CVD method, to form the first inorganic layer 82. Subsequently, an organic material is applied on the substrate formed with the first inorganic layer 82, for example, by an ink-jet method, to form the organic layer 84. Then, film forming is performed such that an inorganic insulating film is formed as a single layer or a plurality of inorganic insulating films are layered on the substrate formed with the organic layer 84 by using a film-forming mask (CMM), for example, by a plasma CVD method, to form the second inorganic layer 86.

In this way, in the sealing film forming process ST3, the sealing film 80 is formed so as to cover the plurality of organic EL elements 70.

Flexibilization Process

In the flexibilization process ST4, first, a surface protection film is bonded on the sealing film 80. Next, the glass substrate is peeled from the back face of the resin substrate layer 10 by irradiating the back face of the substrate formed with the sealing film 80 from the glass substrate 100 side with laser light. Then, a back face protection film 12 is bonded to the back face of the resin substrate layer 10 from which the glass substrate 100 has been peeled off.

Mounting Process

In the mounting process ST5, a wiring line substrate Cb is connected to the terminal portion T of the substrate from which the glass substrate 100 is peeled off by using a conductive material such as an Anisotropic Conductive Film (ACF), an Anisotropic Conductive Paste (ACP) or the like, and thus, an external circuit such as the display control circuit is mounted together with the wiring line substrate Cb by making the wiring line substrate Cb conductive with the terminal portion T.

The organic EL display device 1 according to the present embodiment can be manufactured as described above.

Features of First Embodiment

According to the organic EL display device 1 of the first embodiment, in the TFT layer 20, the dummy electrode 28*dm* is covered with the interlayer insulating film 35, and is provided so as to overlap the first electrode 62*fe*, the contact hole 38*h* of the flattening film 38*pf*, and the conduction electrode 36*sd* of the light emission control transistor 50F in a plan view, so that in a case where peeling electrification occurs between the film-forming mask 100 and the mask spacer 64*ms* when the individual light-emitting layer 66*em* is formed and the film-forming mask 100 is separated from the mask spacer 64*ms* in manufacturing the organic EL display device 1, electrostatic discharge can occur between the conduction electrode 36*sd* of the light emission control transistor 50F and the dummy electrode 28*dm*. This makes it possible to suppress the occurrence of electrostatic discharge between the conduction electrode 36*sd* of the light emission control transistor 50F and the emission control wiring line 28*el*. As a result, it is possible to avoid generating a line defect caused by the breakage of an electric element of the emission driver Ed.

Second Embodiment

Figure 24:
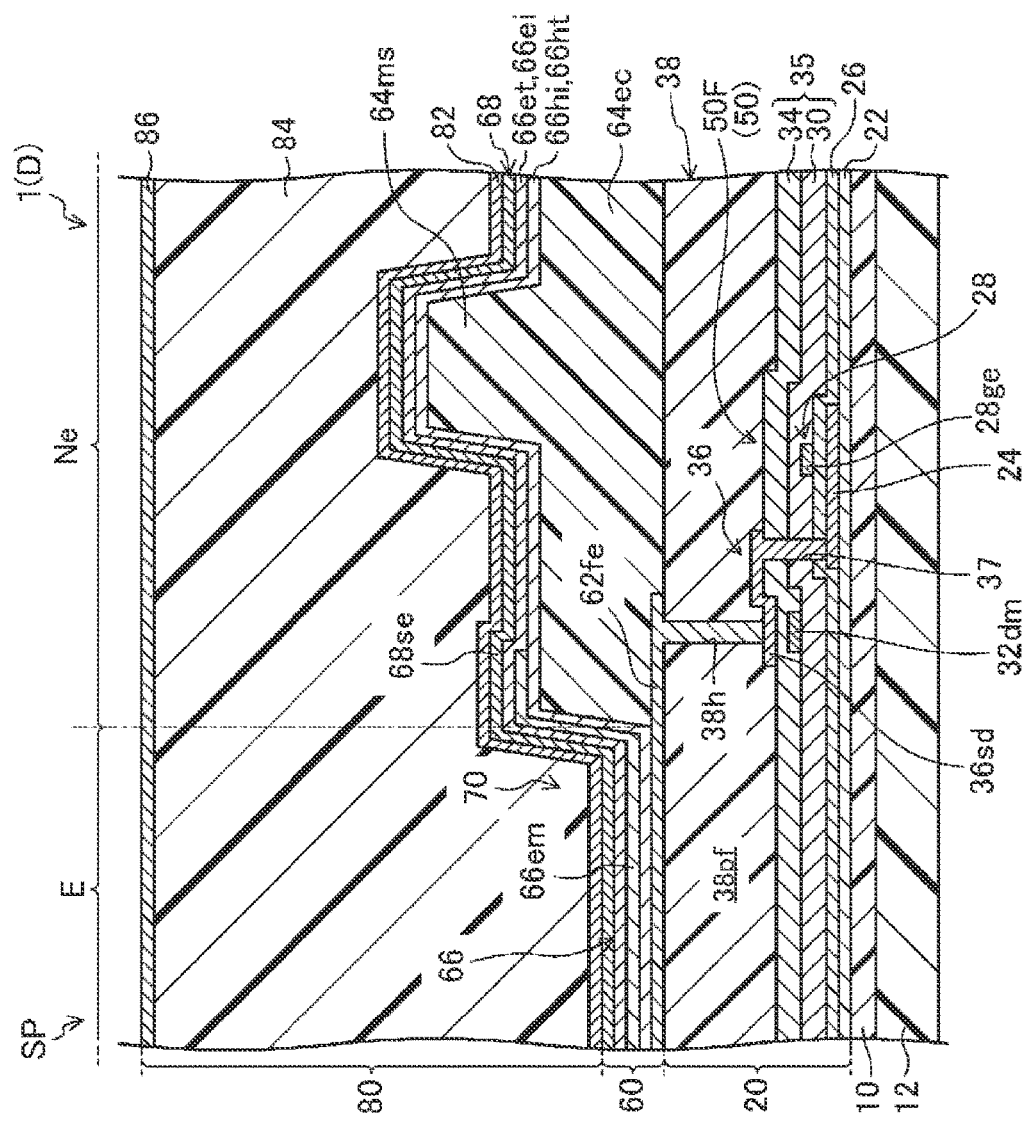
FIG. 24 is a diagram equivalent to FIG. 7 of an organic EL display device according to a second embodiment.

The organic EL display device 1 according to a second embodiment differs from that of the first embodiment in a layer constituting each dummy electrode 28*dm*. Note that the organic EL display device 1 according to the present embodiment is configured in a similar manner to that of the first embodiment, except that the layer constituting each dummy electrode 28*dm* is different from that of the first embodiment. FIG. 24 is a diagram equivalent to FIG. 7 of the organic EL display device 1 according to the second embodiment.

In the organic EL display device 1 according to the first embodiment, each dummy electrode 28*dm* is included in the first conductive layer 28. In contrast, as illustrated in FIG. 24, in the organic EL display device 1 according to the present embodiment, each of dummy electrodes 32*dm* is included in the second conductive layer 32.

The dummy electrode 32*dm* is formed of the same material in the same layer as the initialization power source wiring line 32*il*, the first power source wiring line 32*pl*, and the second capacitance electrode 32*ce*. Each dummy electrode 32*dm* is covered with the second interlayer insulating film 34 of the interlayer insulating film 35. Further, in each subpixel SP, the dummy electrode 32*dm* overlaps the first electrode 62*fe*, the contact hole 38*h* of the flattening film 38*pf*, and the conduction electrode 36*sd* of the light emission control transistor 50F in a plan view.

In order to manufacture the organic EL display device 1 according to the present embodiment, it may be sufficient that in the manufacturing method of the organic EL display device 1 described in the first embodiment, the plurality of dummy electrodes 28*dm* are not formed in the first conductive layer forming process ST1-4, and the plurality of dummy electrodes 32*dm* are formed together with the plurality of initialization power source wiring lines 32*il*, the plurality of first power source wiring lines 32*pl*, and the plurality of second capacitance electrodes 32*ce* in the second conductive layer forming process ST1-6.

Features of Second Embodiment

According to the organic EL display device 1 of the second embodiment, the dummy electrode 32*dm* is included in the second conductive layer 32, and thus, a distance of the dummy electrode 32dm with respect to the conduction electrode 36sd of the light emission control transistor 50F can be shortened compared to the case where the dummy electrode 28dm is included in the first conductive layer 28 as in the first embodiment. This is advantageous in manufacturing the organic EL display device 1 for guiding electrostatic discharge that occurs when peeling electrification occurs between the film-forming mask 100 and the mask spacer 64ms, to between the conduction electrode 36sd of the light emission control transistor 50F and the dummy electrode 28dm. Thus, it is possible to suitably suppress the occurrence of the electrostatic discharge between the conduction electrode 36sd and the emission control wiring line 28el.

Third Embodiment

Figure 25:
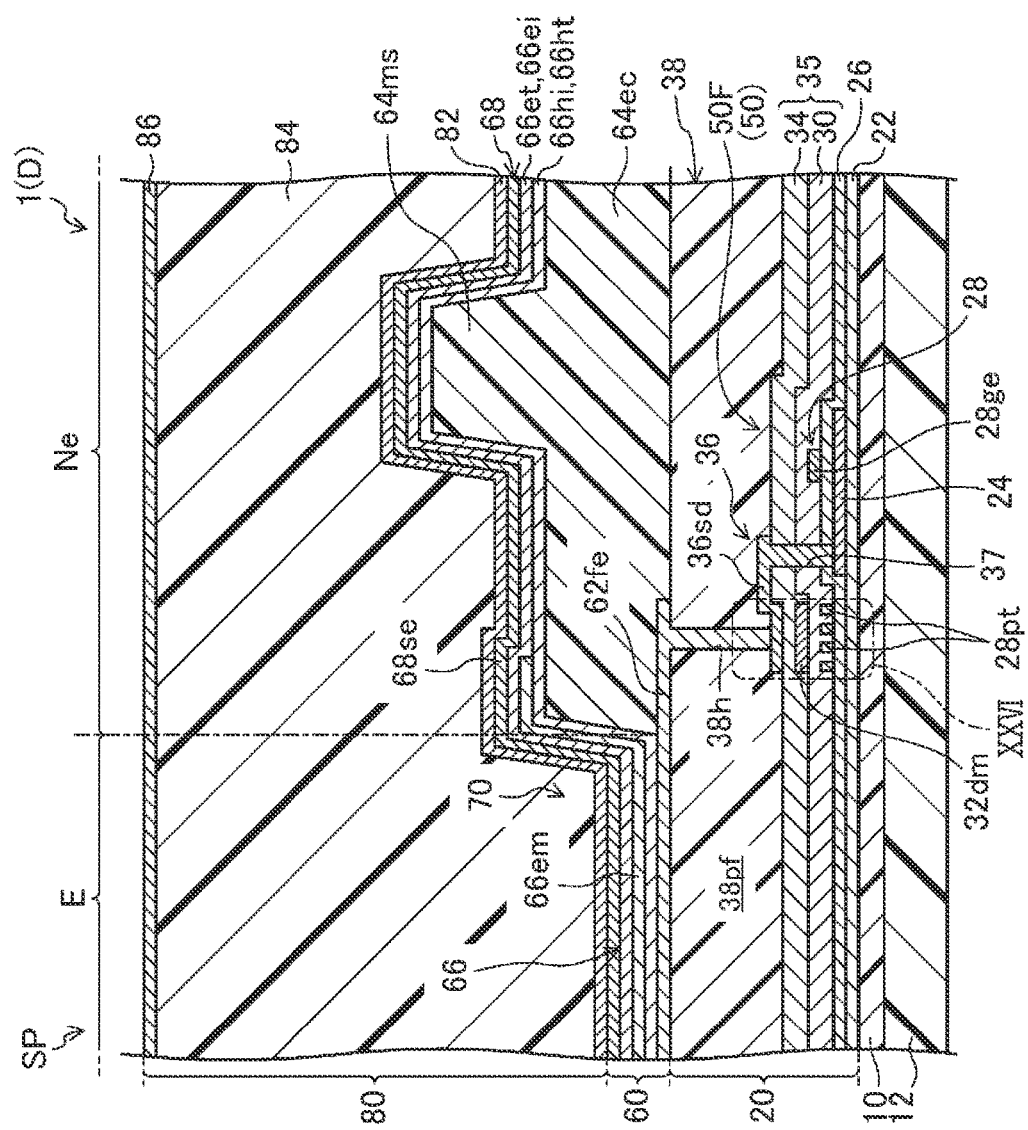
FIG. 25 is a diagram equivalent to FIG. 7 of an organic EL display device according to a third embodiment.
Figure 26:
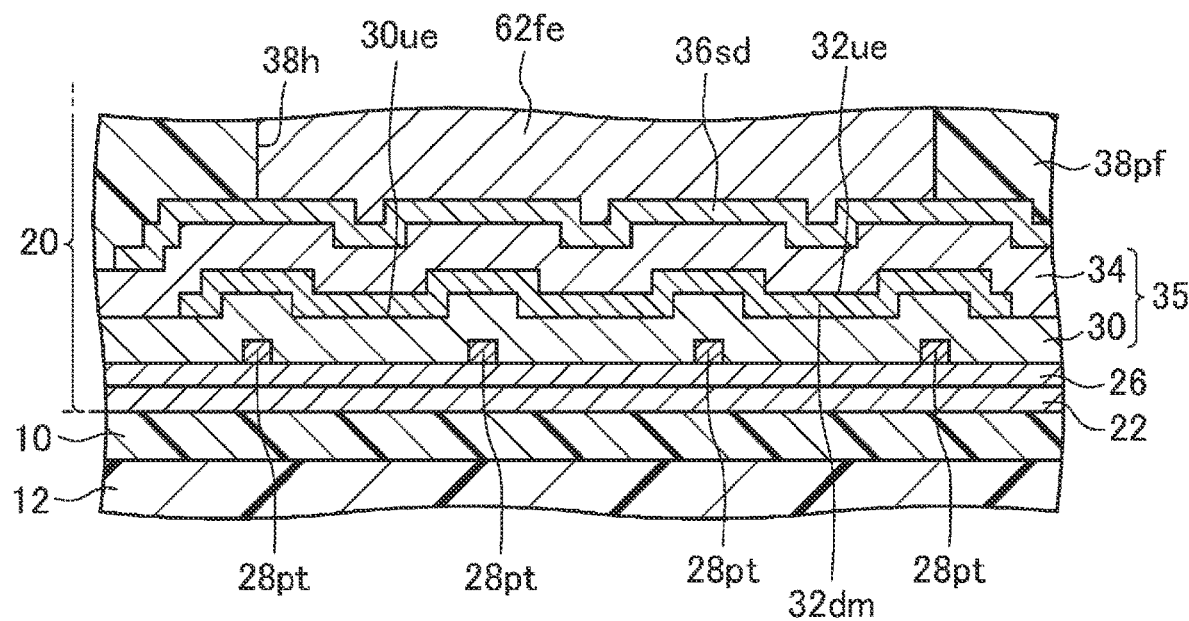
FIG. 26 is a cross-sectional view illustrating a main portion of the organic EL display device surrounded by XXVI in FIG. 12.

The organic EL display device 1 according to a third embodiment differs from that of the first embodiment in an arrangement of the dummy electrode 28dm and the periphery thereof. Note that the organic EL display device 1 according to the present embodiment is configured in a similar manner to that of the first embodiment, except that the configuration of the dummy electrode 28dm and the periphery thereof is different from that of the first embodiment. FIG. 25 is a diagram equivalent to FIG. 7 of the organic EL display device 1 according to the third embodiment. FIG. 26 is a cross-sectional view illustrating a main portion of the organic EL display device 1 surrounded by XXVI in FIG. 25.

In the organic EL display device 1 according to the first embodiment, the dummy electrode 28dm is included in the first conductive layer 28. In contrast, as illustrated in FIG. 25 and FIG. 26, in the organic EL display device 1 according to the present embodiment, the dummy electrode 32dm is included in the second conductive layer 32. Furthermore, the first conductive layer 28 includes a plurality of projecting objects 28pt provided for each subpixel SP instead of the dummy electrode 28dm.

The plurality of projecting objects 28pt provided for each subpixel SP are formed in a pattern finer than the dummy electrode 32dm. Each projecting object 28pt is formed in a columnar shape having a rectangular shape, a circular shape, or the like in a plan view. Each projecting object 28pt may have another shape, and for example, may be formed in a projecting strip that linearly extends. In the individual subpixel SP, the plurality of projecting objects 28pt are arrayed in a predetermined pattern such as a matrix shape in a plan view.

The dummy electrode 32dm is provided so as to overlap the plurality of projecting objects 28pt in a plan view. In the first interlayer insulating film 30, recesses and protrusions 30ue that reflect the steps between the projecting objects 28pt and the surface of the base coat film 22 are formed. The steps due to the recesses and protrusions 30ue of the surface of the first interlayer insulating film 30 are reflected in the dummy electrode 32dm. In other words, the recesses and protrusions 32ue that reflect the steps between the projecting objects 28pt and the surface of the base coat film 22 are formed in the dummy electrode 32dm.

In order to manufacture the organic EL display device 1 according to the present embodiment, it may be sufficient that in the manufacturing method of the organic EL display device 1 described in the first embodiment, the plurality of projecting objects 28pt are formed together with the plurality of gate electrodes 28ge, the plurality of emission control wiring lines 28el, the plurality of first partial wiring lines 28al, the plurality of gate wiring lines 28gl, and the plurality of first capacitance electrodes 28ce in the first conductive layer forming process ST1-4, and the plurality of dummy electrodes 32dm are formed together with the plurality of initialization power source wiring lines 32il, the plurality of first power source wiring lines 32pl, and the plurality of second capacitance electrodes 32ce in the second conductive layer forming process ST1-6.

Features of Third Embodiment

According to the organic EL display device 1 of the third embodiment, the dummy electrode 32dm is formed with the recesses and protrusions 32ue reflecting the steps between the projecting objects 28pt and the surface of the base coat film 22, and thus, a distance of the dummy electrode 32dm with respect to the conduction electrode 36sd of the light emission control transistor 50F can be shortened at a portion where the dummy electrode 32dm is made to be convex as compared to the case in which the dummy electrode 28dm is flat, as in the second embodiment. This is advantageous in manufacturing the organic EL display device 1 for guiding electrostatic discharge that occurs when peeling electrification occurs between the film-forming mask 100 and the mask spacer 64ms, to between the conduction electrode 36sd of the light emission control transistor 50F and the dummy electrode 28dm. Thus, it is possible to more suitably suppress the occurrence of electrostatic discharge between the conduction electrode 36sd and the emission control wiring line 28el.

First Modified Example of First to Third Embodiments

Figure 27:
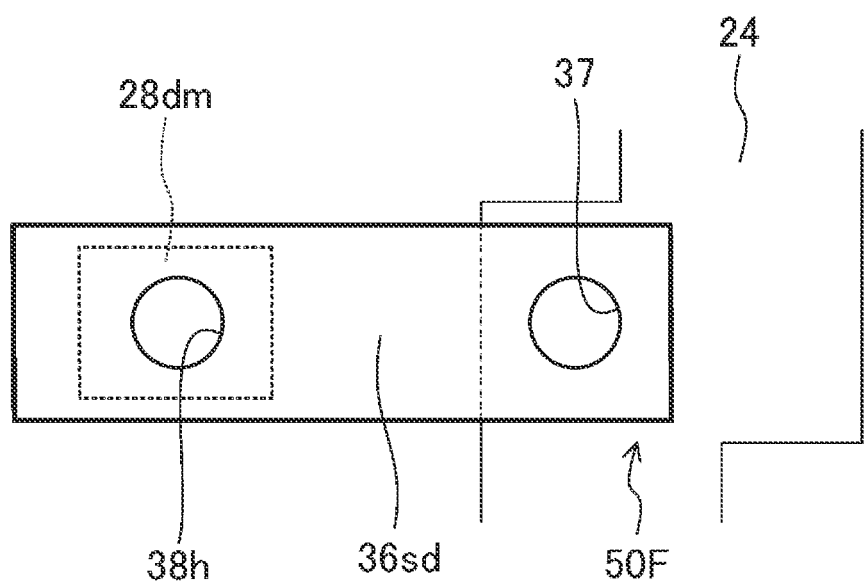
FIG. 27 is a diagram equivalent to FIG. 6 of an organic EL display device according to a first modified example of the first to third embodiments.

FIG. 27 is a diagram equivalent to FIG. 5 of the organic EL display device 1 according to this first modified example. As illustrated in FIG. 27, in the organic EL display device 1, the conduction electrode 36sd of the light emission control transistor 50F may overlap the entire corresponding dummy electrode 28dm with the interlayer insulating film 35 interposed therebetween. That is, the dummy electrode 28dm may be surrounded by the peripheral edge of the conduction electrode 36sd of the light emission control transistor 50F in a plan view.

Second Modified Example of First to Third Embodiments

Figure 28:
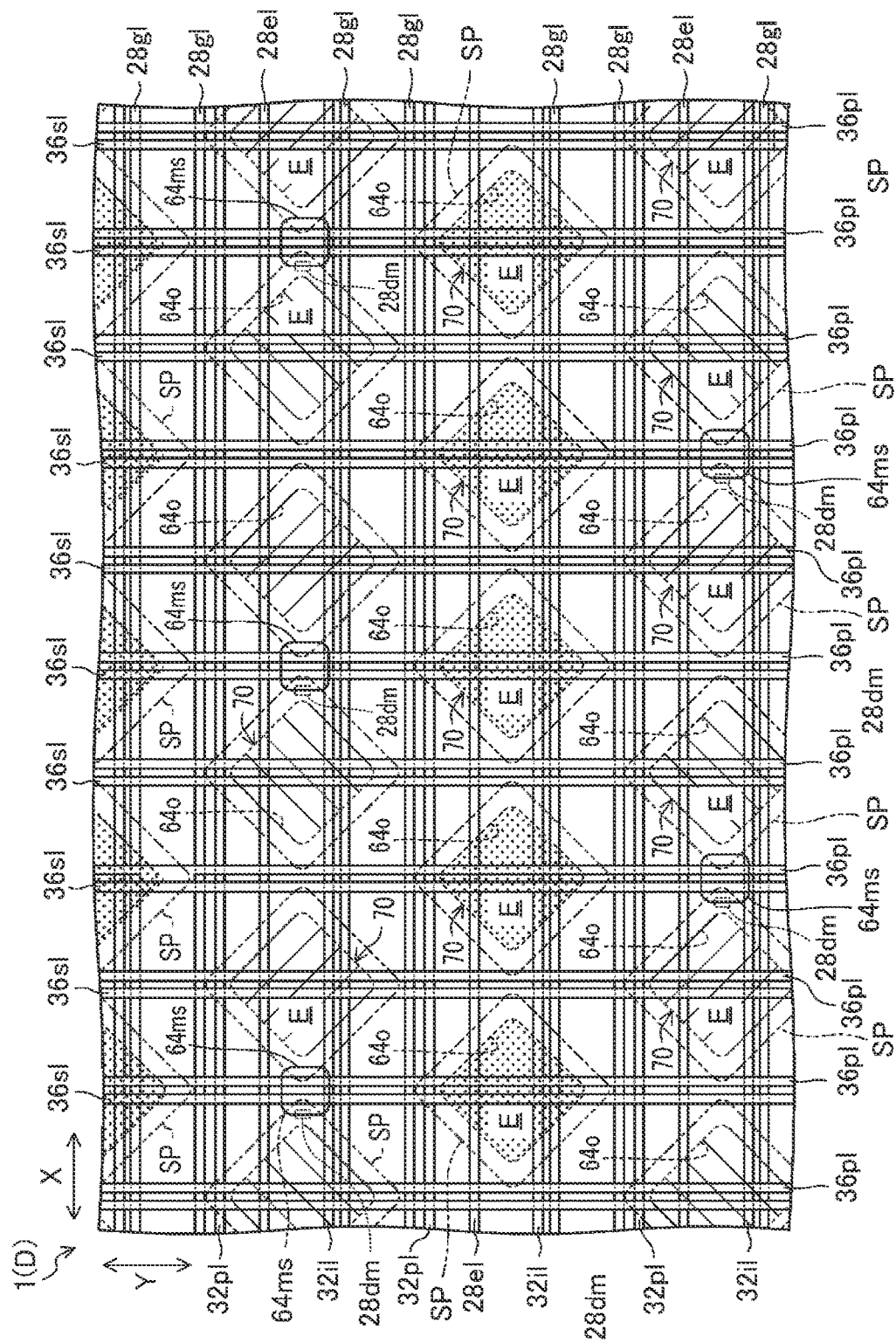
FIG. 28 is a diagram equivalent to FIG. 3 of an organic EL display device according to a second modified example of the first to third embodiments.
Figure 29:
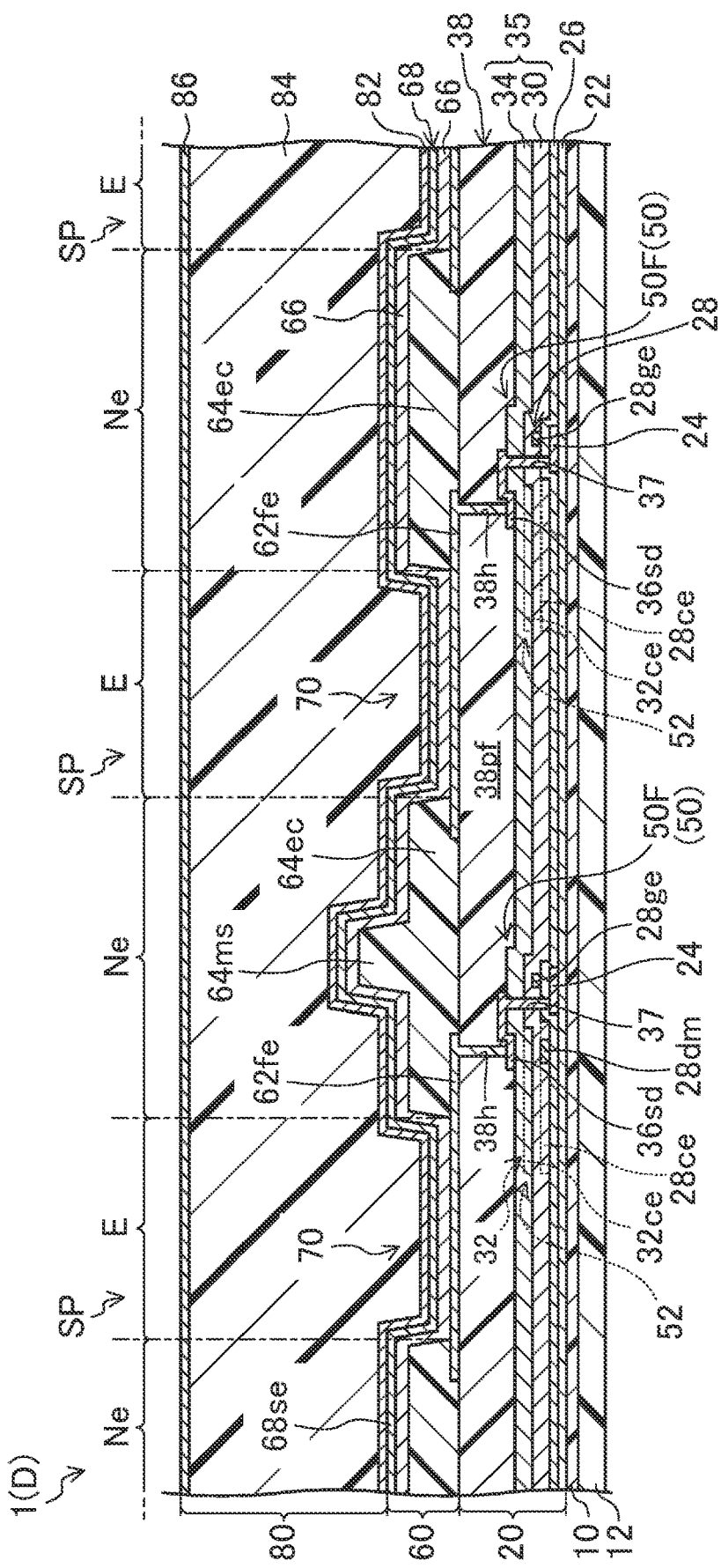
FIG. 29 is a diagram equivalent to FIG. 4 of the organic EL display device according to the second modified example of the first embodiment.
Figure 30:
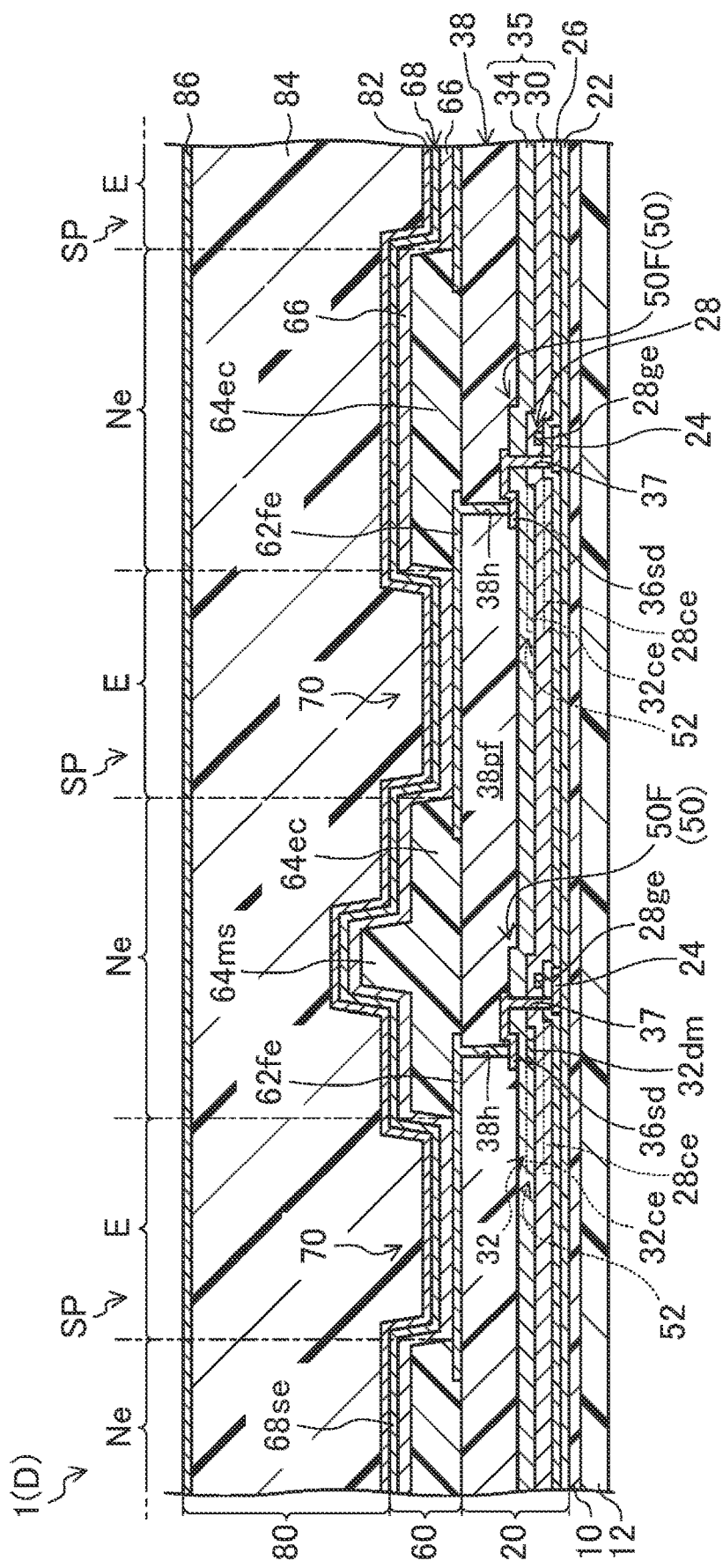
FIG. 30 is a diagram equivalent to FIG. 4 of the organic EL display device according to the second modified example of the second embodiment.
Figure 31:
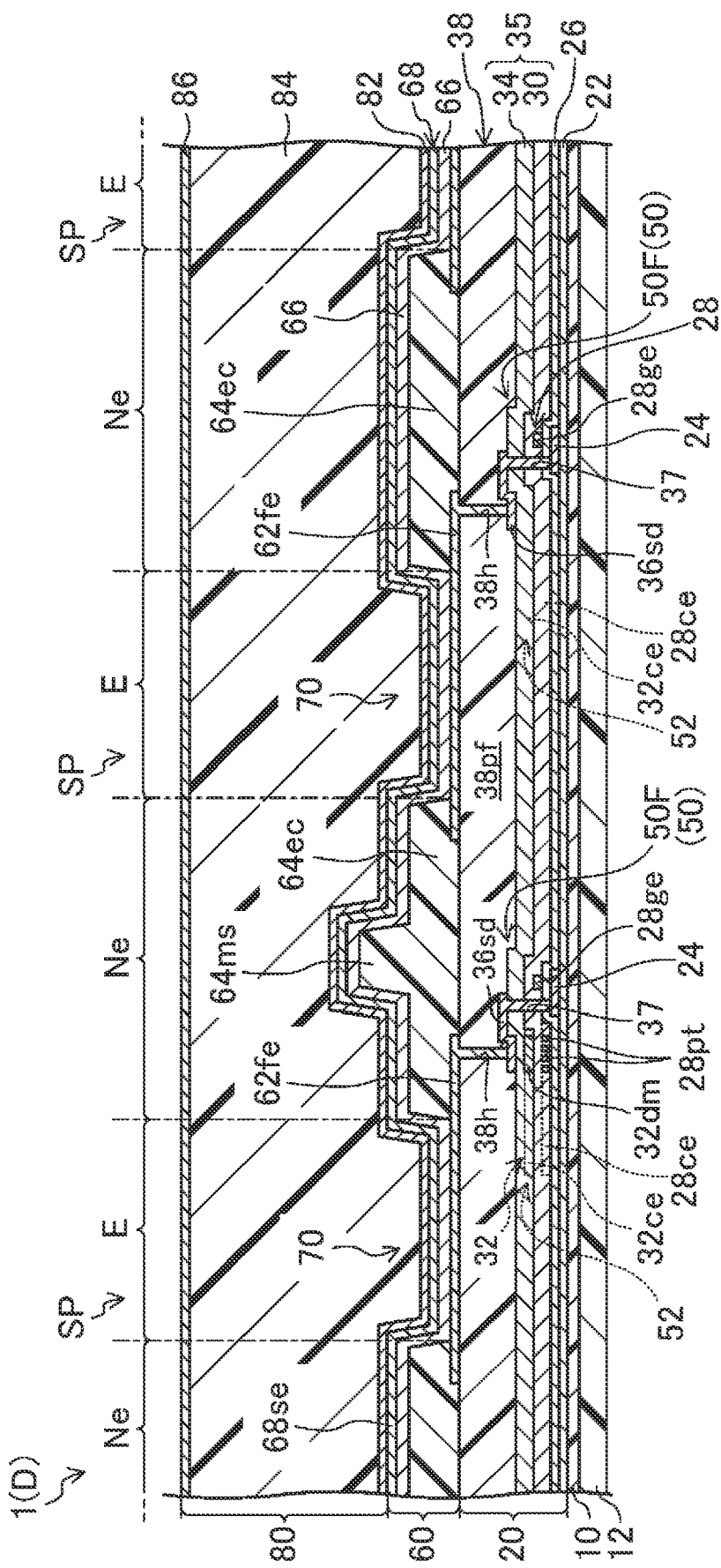
FIG. 31 is a diagram equivalent to FIG. 4 of the organic EL display device according to the second modified example of the third embodiment.

FIG. 28 is a diagram equivalent to FIG. 3 of the organic EL display device 1 according to this second modified example. FIG. 29 is a diagram equivalent to FIG. 4 of the organic EL display device 1 according to the second modified example of the first embodiment. FIG. 30 is a diagram equivalent to FIG. 4 of the organic EL display device 1 according to the second modified example of the second embodiment. FIG. 31 is a diagram equivalent to FIG. 4 of the organic EL display device 1 according to the second modified example of the third embodiment.

As illustrated in FIG. 28, in the organic EL display device 1, the dummy electrode 28dm may be provided only around each of the plurality of mask spacers 64ms. Specifically, as illustrated in FIG. 29, in the organic EL display device 1 according to the second modified example of the first embodiment, the dummy electrode 28dm included in the first conductive layer 28 may be provided only with respect to the conduction electrode 36sd of the light emission control transistor 50F positioned around the mask spacer 64ms.

Additionally, as illustrated in FIG. 30, in the organic EL display device 1 according to the second modified example of the second embodiment, the dummy electrode 32dm included in the second conductive layer 32 may be provided only with respect to the conduction electrode 36sd of the light emission control transistor 50F positioned around the mask spacer 64ms. Also, as illustrated in FIG. 31, in the organic EL display device 1 according to the second modified example of the third embodiment, the plurality of projecting objects 28pt included in the first conductive layer 28 and the dummy electrode 32dm included in the second conductive layer 32 may be provided only with respect to the conduction electrode 36sd of the light emission control transistor 50F positioned around the mask spacer 64ms.

OTHER EMBODIMENTS

In the organic EL display device 1 according to the first to third embodiments described above and the modified examples thereof, some function layers among the hole injection layer 66hi, the hole transport layer 66ht, the electron transport layer 66et, and the electron injection layer 66ei may be provided separately for each of the subpixels SP. Additionally, the light-emitting layer 66em may be provided commonly for the plurality of subpixels SP in a continuous manner. In this case, the organic EL display device 1 may include a color filter, for example, to perform color tone expression of each of the subpixels SP.

In the organic EL display device 1 according to the first to third embodiments described above and the modified examples thereof, the number of colors of the sub pixels SP constituting each pixel is not limited to three, and may be equal to or more than four. Also, the three colors of subpixels SP constituting each pixel are arrayed so as to form an oblique lattice pattern, but the array of the plurality of subpixels SP constituting each pixel may be other arrays, such as a stripe array.

In the organic EL display device 1 according to the first to third embodiments described above and the modified examples thereof, the plurality of TFTs 50 (the first initialization transistor 50A, the threshold value compensation transistor 50B, the write control transistor 50C, the drive transistor 50D, the power supply transistor 50E, the light emission control transistor 50F, and the second initialization transistor 50G) may be a bottom gate type. Further, the number of the TFTs 50 provided for each of the subpixels SP may be equal to or less than two, or may be equal to or more than four.

In the organic EL display device 1 according to the first to third embodiments described above and the modified examples thereof, the first electrode 62fe is an anode electrode, and the second electrode 68se is a cathode electrode. However, the first electrode 62fe may be a cathode electrode, and the second electrode 68se may be an anode electrode. In this case, the organic EL layer 66 has an inverted layered structure, for example.

In the organic EL display device 1 according to the first to third embodiments described above and the modified examples thereof, the organic EL layer 66 has a five-layer structure including the hole injection layer 66hi, the hole transport layer 66ht, the light-emitting layer 66cm, the electron transport layer 66et, and the electron injection layer 66ei. However, the organic EL layer 66 may have a three-layer structure including a hole injection and hole transport layer, the light-emitting layer 66cm, and an electron transport and electron injection layer, and any structure can be employed.

In the first to third embodiments described above and the modified examples thereof, the organic EL display device 1 has been described as an example of a display device. However, the technique of the disclosure is not limited to this display device. The technique of the disclosure can be applied to a display device provided with a plurality of light-emitting elements to be driven by a current. For example, the technique of the disclosure is applicable to a display device provided with quantum-dot light emitting diodes (QLEDs), which are light-emitting elements using a quantum dot-containing layer.

As described above, the preferred embodiments are described as examples of the technique of the disclosure. However, the technique of the disclosure is not limited to the embodiments and the modified examples, and is also applicable to an embodiment in which modification, replacement, adding, omission, and the like are suitably made. Each of the constituent elements described in the embodiments described above can be combined into a new embodiment. The constituent elements described in the accompanying drawings and detailed description may also include constituent elements that are not essential for the purpose of solving the problems. As such, those constituent elements that are not essential should not be recognized as being essential immediately as described in the accompanying drawings and detailed description.

INDUSTRIAL APPLICABILITY

As described above, the technique of the disclosure is useful for a display device.

The invention claimed is:

1. A display device comprising a display region, a frame region surrounding the display region, and, in the display region:
   a substrate;
   a thin film transistor layer provided on the substrate, the thin film transistor layer including a plurality of thin film transistors; and
   a light-emitting element layer provided on the thin film transistor layer, the light-emitting element layer including a plurality of light-emitting elements,
   wherein the light-emitting element layer includes:
      a first electrode provided for each of the plurality of light-emitting elements,
      a light-emitting function layer provided on the first electrode,
      a second electrode provided on the light-emitting function layer, and
      a mask spacer covered by the light-emitting function layer,
   the plurality of thin film transistors includes a light emission control transistor covered with a flattening film provided on the thin film transistor layer, the light emission control transistor being provided for each of the plurality of light-emitting elements,
   the light emission control transistor includes a conduction electrode electrically connected to the first electrode through a contact hole formed in the flattening film,
   the thin film transistor layer includes a control wiring line electrically connected to the light emission control transistor, and an interlayer insulating film provided between the control wiring line and the conduction electrode, the control wiring line is electrically connected to a drive circuit configured to supply a signal to the light emission control transistor, the thin film transistor layer further includes, in the display region, a dummy electrode covered with the interlayer insulating film, the dummy electrode having an island shape and being formed of a conductive material, and the dummy electrode is provided to overlap the first electrode, the contact hole, and the conduction electrode in a plan view, and only the interlayer insulating film is interposed therebetween the dummy electrode and the conduction electrode.

2. The display device according to claim 1, wherein the conductive material is identical to a material of the control wiring line in a layer identical to a layer of the control wiring line.

3. The display device according to claim 1, wherein the thin film transistor layer further includes:
   a first conductive layer including the control wiring line,
   a first interlayer insulating film provided on the first conductive layer,
   a second conductive layer provided on the first interlayer insulating film,
   a second interlayer insulating film provided on the second conductive layer, and
   a third conductive layer provided on the second interlayer insulating film,
the interlayer insulating film is formed by the first interlayer insulating film and the second interlayer insulating film,
the conduction electrode is included in the third conductive layer, and
the dummy electrode is included in the first conductive layer or the second conductive layer.

4. The display device according to claim 1, wherein the dummy electrode is included in the second conductive layer,
the first conductive layer includes a plurality of projecting objects formed for the dummy electrode in a pattern being finer than a pattern of the dummy electrode,
the dummy electrode is provided to overlap the plurality of projecting objects in the plan view, and
the dummy electrode is formed with a recess and a protrusion reflecting a step between each of the plurality of projecting objects and a surface on which the plurality of projecting objects are formed on the substrate.

5. The display device according to claim 4, wherein each of the plurality of projecting objects overlaps the dummy electrode in the plan view.

6. The display device according to claim 1, wherein the dummy electrode and the conduction electrode extend in directions that intersect each other, and
the dummy electrode extends from one side to another side in a width direction of the conduction electrode in the plan view.

7. The display device according to claim 1, wherein an entire peripheral edge of an opening on a side of the conduction electrode of the contact hole overlaps the conduction electrode and the dummy electrode in the plan view.

8. The display device according to claim 1, wherein a plurality of mask spacers, including the mask spacer, is provided to positions around at least every other conduction electrode, among a plurality of conduction electrodes of a plurality of light emission control transistors corresponding to the plurality of light-emitting elements, the plurality of conduction electrodes including the conduction electrode and the plurality of light emission control transistors including the light emission control transistor, each of the plurality of mask spacers being provided in a non-emitting light region between light-emitting elements, among the plurality of light-emitting elements, that are adjacent to each other, and
the dummy electrode is provided only to the every other conduction electrode positioned around each of the plurality of the mask spacers.

9. A manufacturing method of a display device, comprising a display region, a frame region surrounding the display region, and, in the display region, a substrate, a thin film transistor layer, and a light-emitting element layer, the manufacturing method comprising:
   forming the thin film transistor layer including a plurality of thin film transistors on the substrate; and
   forming the light-emitting element layer including a plurality of light-emitting elements on the thin film transistor layer,
wherein forming of the thin film transistor layer includes:
   forming a conductive layer, such that to form a dummy electrode, in the display region, made of a conductive material, the dummy electrode having an island shape, and a control wiring line electrically connected to a drive circuit,
   forming an interlayer insulating film, such that to cover the dummy electrode and the control wiring line,
   forming a conduction electrode of a thin film transistor, among the plurality of thin film transistors, connected to the control wiring line for each of the plurality of light-emitting elements on the interlayer insulating film, and
   forming a flattening film formed with a contact hole exposing the conduction electrode at a bottom portion of the contact hole, such that to cover a plurality of conduction electrodes, including the conduction electrode, forming of the light-emitting element layer includes:
   forming a first electrode electrically connected to the conduction electrode through the contact hole formed in the flattening film for each of the plurality of light-emitting elements,
   forming a mask spacer around at least one first electrode, among a plurality of first electrodes, including the first electrode,
   forming a light-emitting function layer, such that to cover the plurality of the first electrodes and the mask spacer, and
   forming a second electrode on the light-emitting function layer, such that to overlap each of the plurality of the first electrodes with the light-emitting function layer interposed between the second electrode and each of the plurality of the first electrodes,
in forming of the conductive layer, the dummy electrode is formed at a position where the dummy electrode overlaps the first electrode, the contact hole, and the conduction electrode in a plan view, and
only the interlayer insulating film is interposed therebetween the dummy electrode and the conduction electrode.

* * * * *